United States Patent
Yu et al.

(10) Patent No.: US 12,199,024 B2
(45) Date of Patent: Jan. 14, 2025

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Chen-Hua Yu, Hsinchu (TW); Sung-Feng Yeh, Taipei (TW); Ming-Fa Chen, Taichung (TW); Hsien-Wei Chen, Hsinchu (TW); Tzuan-Horng Liu, Longtan Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 132 days.

(21) Appl. No.: 17/882,239

(22) Filed: Aug. 5, 2022

(65) Prior Publication Data

US 2022/0384327 A1 Dec. 1, 2022

Related U.S. Application Data

(63) Continuation of application No. 17/001,010, filed on Aug. 24, 2020, now Pat. No. 11,456,240, which is a
(Continued)

(51) Int. Cl.
*H01L 21/56* (2006.01)
*H01L 21/48* (2006.01)
(Continued)

(52) U.S. Cl.
CPC ...... *H01L 23/49827* (2013.01); *H01L 21/486* (2013.01); *H01L 21/56* (2013.01); *H01L 21/561* (2013.01); *H01L 21/6835* (2013.01); *H01L 21/76898* (2013.01); *H01L 23/3128* (2013.01); *H01L 23/3185* (2013.01); *H01L 24/19* (2013.01); *H01L 24/80* (2013.01); *H01L 24/89* (2013.01); *H01L 24/96* (2013.01);
(Continued)

(58) Field of Classification Search
None
See application file for complete search history.

(56) References Cited

U.S. PATENT DOCUMENTS 8,361,842 B2 1/2013 Yu et al.
8,680,647 B2 3/2014 Yu et al.
(Continued)

FOREIGN PATENT DOCUMENTS

CN 105390476 A 3/2016
CN 105428334 A 3/2016
(Continued)

*Primary Examiner* — Jay C Chang
(74) *Attorney, Agent, or Firm* — Slater Matsil, LLP

(57) ABSTRACT

A semiconductor device and method of manufacture are presented in which a first semiconductor device and second semiconductor device are bonded to a first wafer and then singulated to form a first package and a second package. The first package and second package are then encapsulated with through interposer vias, and a redistribution structure is formed over the encapsulant. A separate package is bonded to the through interposer vias.

20 Claims, 31 Drawing Sheets

Related U.S. Application Data continuation of application No. 16/716,201, filed on Dec. 16, 2019, now Pat. No. 10,756,010, which is a continuation of application No. 16/025,440, filed on Jul. 2, 2018, now Pat. No. 10,510,650.

(60) Provisional application No. 62/625,825, filed on Feb. 2, 2018.

(51) Int. Cl.
*H01L 21/683* (2006.01)
*H01L 21/768* (2006.01)
*H01L 23/00* (2006.01)
*H01L 23/31* (2006.01)
*H01L 23/498* (2006.01)
*H01L 25/00* (2006.01)

(52) U.S. Cl.
CPC .............. *H01L 24/97* (2013.01); *H01L 25/50* (2013.01); *H01L 21/568* (2013.01); *H01L 2221/68327* (2013.01); *H01L 2221/6834* (2013.01); *H01L 2221/68345* (2013.01); *H01L 2221/68359* (2013.01); *H01L 2221/68372* (2013.01); *H01L 2221/68381* (2013.01); *H01L 2224/80895* (2013.01); *H01L 2224/80896* (2013.01); *H01L 2224/80905* (2013.01); *H01L 2224/89* (2013.01); *H01L 2224/96* (2013.01); *H01L 2224/97* (2013.01)

(56) References Cited

U.S. PATENT DOCUMENTS

| | | | |
|---|---|---|---|
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 10,163,852 B2 | 12/2018 | Yu et al. | |
| 10,354,961 B2 | 7/2019 | Yu et al. | |
| 2011/0291288 A1 | 12/2011 | Wu et al. | |
| 2013/0026468 A1 | 1/2013 | Yoshimuta et al. | |
| 2013/0040423 A1* | 2/2013 | Tung | H01L 21/78 257/E21.602 |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2014/0103488 A1 | 4/2014 | Chen et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0108661 A1 | 4/2015 | Vincent | |
| 2015/0318263 A1* | 11/2015 | Yu | H01L 25/0657 438/109 |
| 2016/0064309 A1 | 3/2016 | Su et al. | |
| 2016/0079220 A1 | 3/2016 | Lin et al. | |
| 2016/0300797 A1* | 10/2016 | Shim | H01L 21/561 |
| 2017/0053902 A1 | 2/2017 | Yu et al. | |
| 2017/0141147 A1 | 5/2017 | Raynor | |
| 2017/0338207 A1 | 11/2017 | Chen et al. | |
| 2018/0033771 A1 | 2/2018 | Yu et al. | |
| 2018/0269188 A1 | 9/2018 | Yu et al. | |
| 2019/0131235 A1 | 5/2019 | Wang et al. | |
| 2019/0244947 A1 | 8/2019 | Yu et al. | |
| 2019/0267354 A1 | 8/2019 | Yu et al. | |

FOREIGN PATENT DOCUMENTS

| | | |
|---|---|---|
| CN | 107180795 A | 9/2017 |
| CN | 107393865 A | 11/2017 |
| TW | 201801201 A | 1/2018 |
| TW | 201804589 A | 2/2018 |

\* cited by examiner

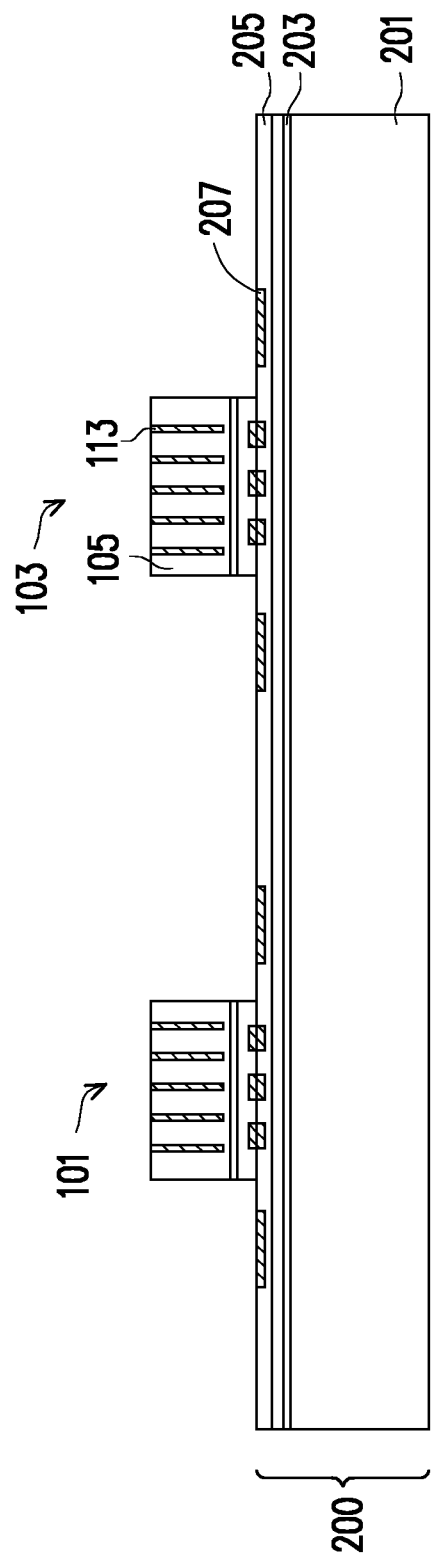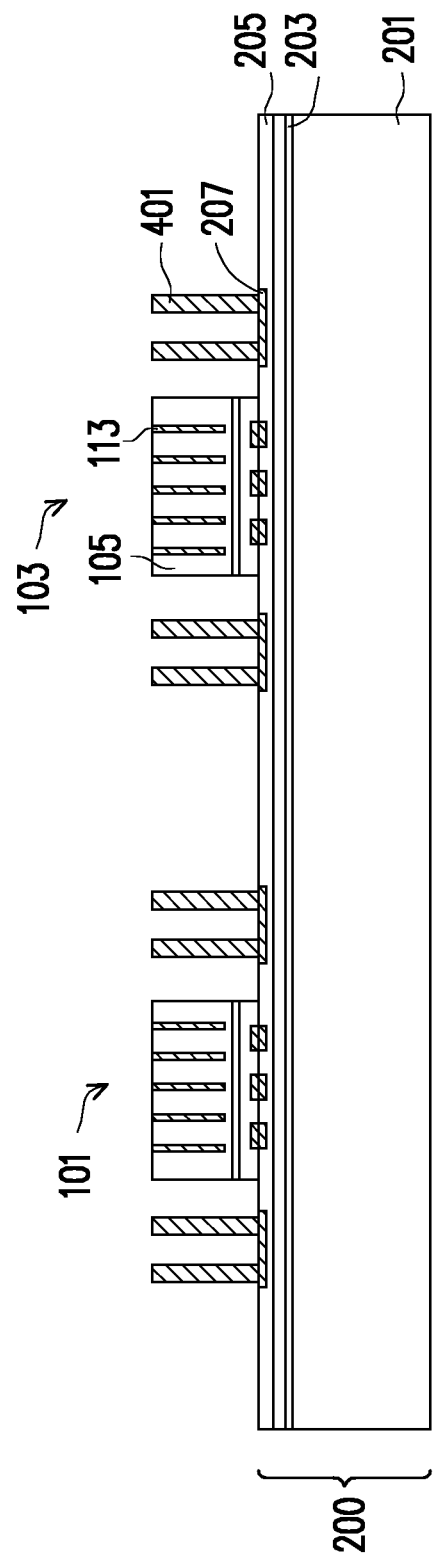

SEMICONDUCTOR DEVICE AND METHOD OF MANUFACTURE

PRIORITY CLAIM AND CROSS-REFERENCE

This application is a continuation of U.S. application Ser. No. 17/001,010, filed on Aug. 24, 2020, now U.S. Pat. No. 11,456,240 issued Sep. 27, 2022, entitled "Semiconductor Device and Method of Manufacture," which is a continuation of U.S. application Ser. No. 16/716,201, filed on Dec. 16, 2019, entitled "Semiconductor Device and Method of Manufacture," now U.S. Pat. No. 10,756,010 issued on Aug. 25, 2020, which is a continuation of U.S. application Ser. No. 16/025,440, filed on Jul. 2, 2018, entitled "Semiconductor Device and Method of Manufacture," now U.S. Pat. No. 10,510,650 issued on Dec. 17, 2019, which application claims priority to and the benefit of U.S. Provisional Application No. 62/625,825, filed on Feb. 2, 2018, entitled "Semiconductor Device and Method of Manufacture," which applications are hereby incorporated herein by reference in their entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates a thinning process in accordance with some embodiments.

FIG. 4 illustrates a formation of first through interposer vias in accordance with some embodiments.

DETAILED DESCRIPTION

Figure 1:
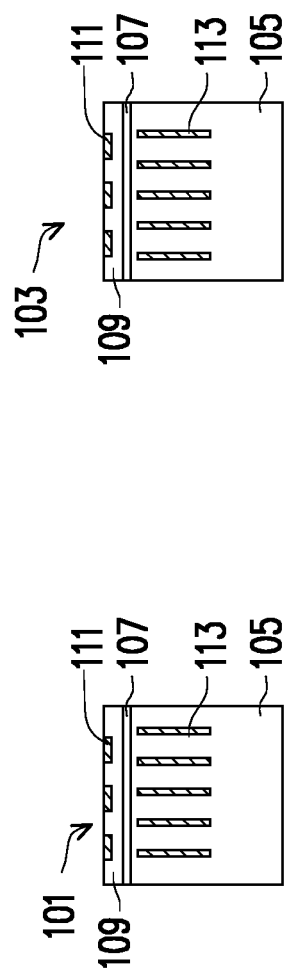
FIG. 1 illustrates a first semiconductor device and a second semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a system on chip along with an integrated fan out package. However, embodiments are not intended to be limited, and may be employed in a wide variety of embodiments.

With respect now to FIG. 1, there is illustrated a first semiconductor device 101 and a second semiconductor device 103. Each of the first semiconductor device 101 and the second semiconductor device 103 may be a semiconductor device such as a memory device, a logic device, a power device, combinations of these, or the like, that is designed to work in conjunction with other devices within the package. However, any suitable functionality may be utilized.

In an embodiment, each of the first semiconductor device 101 and the second semiconductor device 103 may comprise a first substrate 105, first active devices (not separately illustrated), first metallization layers 107, a first bond layer 109, and first bonding metal 111 within the first bond layer 109. The first substrate 105 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional requirements of the design for the first semiconductor device 101 and the second semiconductor device 103. The first active devices may be formed using any suitable methods either within or else on the first substrate 105.

The first metallization layers 107 are formed over the first substrate 105 and the first active devices and are designed to connect the various active devices to form functional circuitry. In an embodiment the first metallization layers 107 are formed of alternating layers of dielectric and conductive material and may be formed through any suitable process (such as deposition, damascene, dual damascene, etc.). In an embodiment there may be four layers of metallization separated from the first substrate 105 by at least one interlayer dielectric layer (ILD), but the precise number of first metallization layers 107 is dependent upon the design.

The first bond layer 109 is deposited over the first metallization layers 107. The first bond layer 109 may be used for fusion bonding (also referred to as oxide-to-oxide bonding). In accordance with some embodiments, the first bond layer 109 is formed of a silicon-containing dielectric material such as silicon oxide, silicon nitride, or the like. The first bond layer 109 may be deposited using any suitable method, such as, CVD, high-density plasma chemical vapor deposition (HDPCVD), PVD, atomic layer deposition (ALD), or the like. The first bond layer 109 may be planarized, for example, in a chemical mechanical polish (CMP) process.

The first bonding metal 111 may be formed within the first bond layer 109. In an embodiment the first bonding metal 111 may be formed by first forming openings within the first bond layer 109 by first applying a photoresist over the top surface of the first bond layer 109 and patterning the photoresist. The photoresist is then used to etch the first bond layer 109 in order to form openings. The first bond layer 109 may be etched by dry etching (e.g., reactive ion etching (RIE) or neutral beam etching (NBE)), wet etching, or the like.

Once the openings have been formed, the openings within the first bond layer 109 are filled with the first bonding metal 111. In an embodiment the first bonding metal 111 may comprise a seed layer and a plate metal. The seed layer may be blanket deposited over top surfaces of the first bond layer 109, and may comprise a copper layer. The seed layer may be deposited using processes such as sputtering, evaporation, or plasma-enhanced chemical vapor deposition (PECVD), or the like, depending upon the desired materials. The plate metal may be deposited over the seed layer through a plating process such as electrical or electro-less plating. The plate metal may comprise copper, a copper alloy, or the like. The plate metal may be a fill material. A barrier layer (not separately illustrated) may be blanket deposited over top surfaces of the first bond layer 109 before the seed layer. The barrier layer may comprise titanium, titanium nitride, tantalum, tantalum nitride, or the like.

The first semiconductor device 101 and the second semiconductor device 103 additionally includes a plurality of through silicon vias (TSVs) 113 that extend through the first substrates 105 of the first semiconductor device 101 and the second semiconductor device 103 so as to provide a quick passage of data signals. In an embodiment the through substrate vias 113 may be formed by initially forming through silicon via (TSV) openings into the first substrates 105. The TSV openings may be formed by applying and developing a suitable photoresist (not shown), and removing portions of the first substrates 105 that are exposed to the desired depth. The TSV openings may be formed so as to extend into the first substrates 105 at least further than the active devices formed within and/or on the first substrates 105, and may extend to a depth greater than the eventual desired height of the first substrates 105. Accordingly, while the depth is dependent upon the overall designs, the depth may be between about 20 μm and about 200 μm from the active devices on the substrates 105, such as a depth of about 50 μm from the active devices on the substrates 105.

Once the TSV openings have been formed within the first substrates 105, the TSV openings may be lined with a liner. The liner may be, e.g., an oxide formed from tetraethylorthosilicate (TEOS) or silicon nitride, although any suitable dielectric material may alternatively be used. The liner may be formed using a plasma enhanced chemical vapor deposition (PECVD) process, although other suitable processes, such as physical vapor deposition or a thermal process, may alternatively be used. Additionally, the liner may be formed to a thickness of between about 0.1 μm and about 5 μm, such as about 1 μm.

Once the liner has been formed along the sidewalls and bottom of the TSV openings, a barrier layer (also not independently illustrated) may be formed and the remainder of the TSV openings may be filled with first conductive material. The first conductive material may comprise copper, although other suitable materials such as aluminum, alloys, doped polysilicon, combinations thereof, and the like, may alternatively be utilized. The first conductive material may be formed by electroplating copper onto a seed layer (not shown), filling and overfilling the TSV openings. Once the TSV openings have been filled, excess liner, barrier layer, seed layer, and first conductive material outside of the TSV openings may be removed through a planarization process such as chemical mechanical polishing (CMP), although any suitable removal process may be used.

Once the TSVs 113 have been prepared, the first semiconductor device 101 and the second semiconductor device 103 may be singulated from each other. In an embodiment the first semiconductor device 101 may be singulated from the second semiconductor device 103 using one or more saw blades that separate the first semiconductor device 101 from the second semiconductor device 103. However, any suitable method of singulation, including laser ablation or one or more wet etches, may also be utilized. After the singulation the first semiconductor device 101 may have a thickness of about 100 μm, an area of about 30 mm$^2$, although any suitable dimensions may be utilized, and known good dies can be separated from defective dies.

Figure 2:
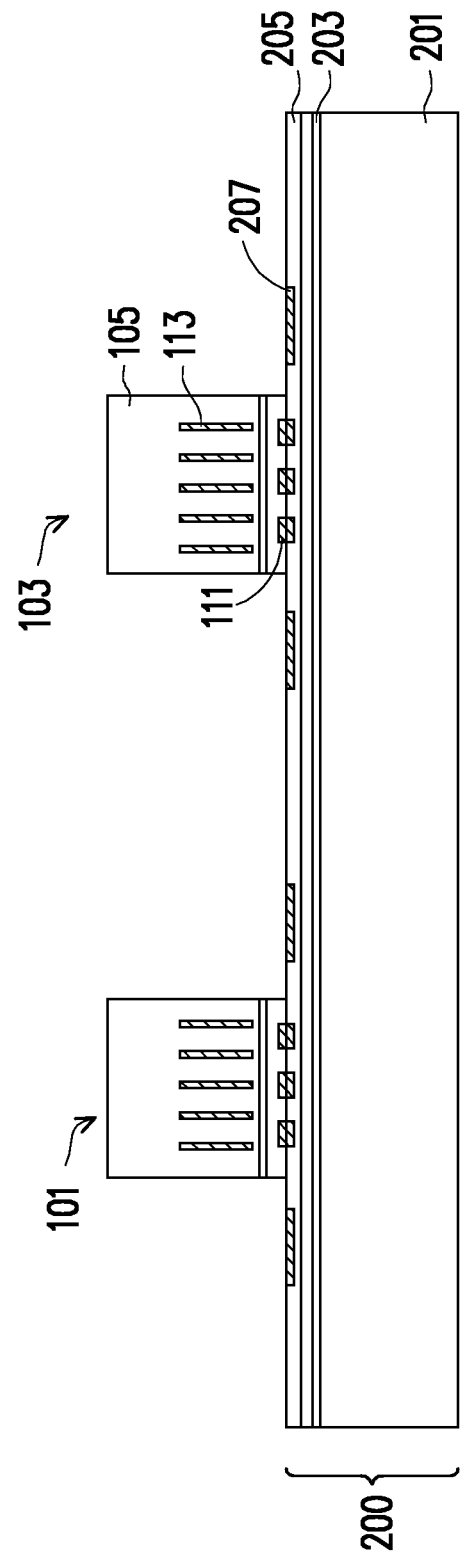
FIG. 2 illustrates a bonding of the first semiconductor device and the second semiconductor device in accordance with some embodiments.

FIG. 2 illustrates a bonding of the first semiconductor device 101 and the second semiconductor device 103 to a first wafer 200. In an embodiment the first wafer 200 may be an application processor wafer in which semiconductor die (not separately illustrated) are formed to work in conjunction with the first semiconductor device 101 or the second semiconductor device 103. However, any suitable functionality, such as additional memory or other functionality, may also be utilized.

The first wafer 200 may comprise a second substrate 201 and second active devices (not separately illustrated in FIG. 2). In an embodiment the second substrate 201 and the second active devices may be similar to the first substrate 105 and the first active devices described above with respect to FIG. 1. For example, the second substrate 201 may be a semiconductor substrate and the second active devices may be active and passives devices formed on or in the second substrate 201. However, any suitable substrate and active devices may be utilized.

The first wafer 200 may also comprise a second metallization layer 203, second bond layer 205, and second bond metal 207. In one embodiment, the second metallization layer 203, the second bond layer 205, and the second bond metal 207 may be similar to the first metallization layer 107, the first bond layer 109 and the first bond metal 111 as described above with respect to FIG. 1. For example, the second bond metal 207 may be a metal placed into the second bond layer 205 after the second bond layer 205 has been formed.

In another embodiment, the second bond metal 207 and the second bond layer 205 are formed as part of the second metallization layer 203. For example, the second bond layer 205 may be formed as an initial dielectric layer overlying the active devices, while the second bond metal 207 may be formed within the second bond layer 205 and adjacent to the active devices, in what is known as a via0 configuration. However, any suitable arrangement for the second bond metal 207 and the second bond layer 205 may be utilized.

Once the second bond layer 205 and the second bond metal 207 have been formed, the first semiconductor device 101 and the second semiconductor device 103 may be bonded to the first wafer 200. In an embodiment the first semiconductor device 101 and the second semiconductor device 103 may be bonded to the first wafer 200 using, e.g., a hybrid bonding process, whereby the first bond layer 109 is bonded to the second bond layer 205 and the first bond metal 111 is bonded to the second bond metal 207. In this embodiment the top surfaces of the first wafer 200, the first semiconductor device 101 and the second semiconductor device 103 may first be activated utilizing, e.g., a dry treatment, a wet treatment, a plasma treatment, exposure to an inert gas, exposure to $H_2$, exposure to $N_2$, exposure to $O_2$, or combinations thereof, as examples. However, any suitable activation process may be utilized.

After the activation process the first wafer 200, the first semiconductor device 101 and the second semiconductor device 103 may be cleaned using, e.g., a chemical rinse, and then the first semiconductor device 101 and the second semiconductor device 103 are aligned and placed into physical contact with the first wafer 200. The first wafer 200, the first semiconductor device 101 and the second semiconductor device 103 are then subjected to thermal treatment and contact pressure to hybrid bond the first wafer 200 to the first semiconductor device 101 and the second semiconductor device 103. For example, the first wafer 200, the first semiconductor device 101 and the second semiconductor device 103 may be subjected to a pressure of about 200 kPa or less, and a temperature between about 200° C. and about 400° C. to fuse the first bond layer 109 and the second bond layer 205. The first wafer 200, the first semiconductor device 101 and the second semiconductor device 103 may then be subjected to a temperature at or above the eutectic point for material of the first bond metal 111 and the second bond metal 207, e.g., between about 150° C. and about 650° C., to fuse the metal bond pads. In this manner, fusion of the first wafer 200, the first semiconductor device 101 and the second semiconductor device 103 forms a hybrid bonded device. In some embodiments, the bonded dies are baked, annealed, pressed, or otherwise treated to strengthen or finalize the bond.

Additionally, while the above description describes the second bonding metal 207 as being within the second metallization layer 203 and the first bonding metal 111 being over the first metallization layer 107, this is intended to be illustrative and is not intended to be limiting. Rather, any suitable combination, including the first bonding metal 111 being located within the first metallization layer 107 (e.g., within the via0 layer), may be utilized. In yet other embodiments, the first wafer 200 may be bonded to the first semiconductor device 101 and the second semiconductor device 103 by direct surface bonding, metal-to-metal bonding, or another bonding process. A direct surface bonding process creates an oxide-to-oxide bond or substrate-to-substrate bond through a cleaning and/or surface activation process followed by applying pressure, heat and/or other bonding process steps to the joined surfaces. In some embodiments, the first wafer 200, the first semiconductor device 101 and the second semiconductor device 103 are bonded by metal-to-metal bonding that is achieved by fusing conductive elements. Any suitable bonding process may be utilized.

FIG. 3 illustrates a thinning of the first semiconductor device 101 and the second semiconductor device 103 in order to expose the TSVs 113. In an embodiment the thinning of the first semiconductor device 101 and the second semiconductor device 103 may be performed utilizing a planarization process such as a chemical mechanical planarization process, whereby etchants and abrasives are utilized along with a grinding platen in order to react and grind away material until a planar surface is formed and the TSVs 113 are exposed. However, any other suitable method of exposing the TSVs 113, such as a series of one or more etching processes, may also be utilized. In an embodiment the first semiconductor device 101 and the second semiconductor device 103 may be thinned to a thickness of about 20 μm, although any suitable dimensions may be utilized.

FIG. 4 illustrates a formation of first through interposer vias (TIVs) 401 onto the second bond metal 207. In an embodiment the first TIVs 401 may be formed by initially placing and patterned a photoresist (not separately illustrated in FIG. 4) over the second bond metal 207 (or over a separately placed seed layer if desired). In an embodiment the photoresist may be placed using, e.g., a spin coating technique. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern.

In an embodiment the pattern formed into the photoresist is a pattern for the first TIVs 401. The first TIVs 401 are formed in such a placement as to be located on different sides of the first semiconductor device 101 and the second semiconductor device 103. However, any suitable arrangement for the pattern of first TIVs 401, such as by being located such that the first semiconductor device 101 and the second semiconductor device 103 are placed on opposing sides of the first TIVs 401, may also be utilized.

Once the photoresist has been placed and patterned, the first TIVs 401 may be formed within the photoresist. In an embodiment the first TIVs 401 comprise one or more conductive materials, such as copper, tungsten, other conductive metals, or the like, and may be formed, for example, by electroplating, electroless plating, or the like. In an embodiment, an electroplating process is used wherein the second bond metal 207 and the photoresist are submerged or immersed in an electroplating solution. The second bond metal 207 surface is electrically connected to the negative side of an external DC power supply such that the second bond metal 207 functions as the cathode in the electroplating process. A solid conductive anode, such as a copper anode, is also immersed in the solution and is attached to the positive side of the power supply. The atoms from the anode are dissolved into the solution, from which the cathode, e.g., the second bond metal 207, acquires the dissolved atoms, thereby plating the exposed conductive areas of the second bond metal 207 within the opening of the photoresist.

Once the first TIVs 401 have been formed using the photoresist and the second bond metal 207, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may alternatively be utilized.

In an embodiment the first TIVs 401 may be formed to have a thickness of about 30 µm. Additionally, the first TIVs 401 may be formed with a width of about 50 µm and has a pitch of about 70 µm. However, any suitable dimensions may be utilized.

In another embodiment the first TIVs 401 may be formed not just as a circular via, but in a wide variety of shapes. In one such embodiment the first TIVs 401 may be formed in a fin shape, wherein the fin shape has a length that is longer than a length of the first semiconductor device 101 and the second semiconductor device 103. For example, the first TIVs 401 may have a length of between about 1 mm and about 30 mm, such as about 10 mm, and may also have a width of between about 10 µm and about 50 µm, such as about 30 µm. However, any suitable dimensions may be utilized.

Figure 5:
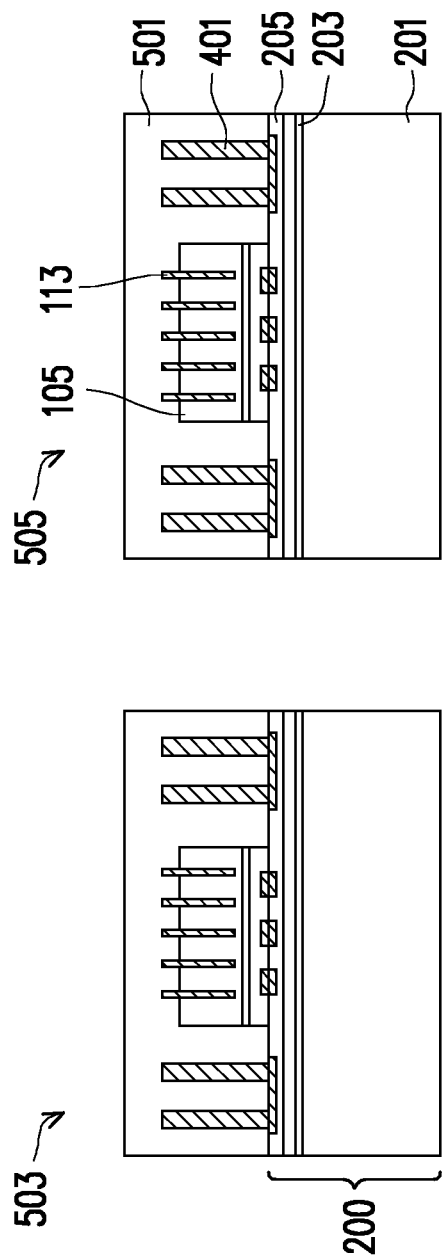
FIG. 5 illustrates a placement of a dielectric material in accordance with some embodiments.

FIG. 5 illustrates that, once the first TIVs 401 have been formed, the first substrates 105 (on both the first semiconductor device 101 and the second semiconductor device 103) may be recessed. In an embodiment the first substrates 105 may be recessed using, e.g., one or more etching processes, such as a wet etching process or a dry etching process. However, any suitable method of recessing the first substrate 105 such that the TSVs 113 extend away from the first substrate 105 may be utilized.

Once the TSVs 113 extend away from the first substrate 105, the first semiconductor device 101, the second semiconductor device 103, and the first TIVs 401 may be covered within a dielectric material 501. In an embodiment the dielectric material 501 may be a dielectric such as a low temperature polyimide material, although any other suitable dielectric, such as PBO, an encapsulant, combinations of these, or the like may also be utilized.

Once the dielectric material 501 has been placed and cured, the first wafer 200 may be thinned and then singulated. In an embodiment a back side of the first wafer 200 may be thinned utilizing, for example, a planarization process such as a chemical mechanical planarization process. However, any suitable process for thinning the first wafer 200, such as a series of one or more etches or a combination of polishing and etching, may also be utilized.

After the first wafer 200 has been thinned, the first wafer 200 may be singulated to form a first package 503 (e.g., a system on integrated circuit package (SoIC)) and a second package 505. In an embodiment the first wafer 200 is singulated using one or more saw blades. However, any suitable method of singulation, including laser ablation or one or more wet etches, may also be utilized.

Figure 6:
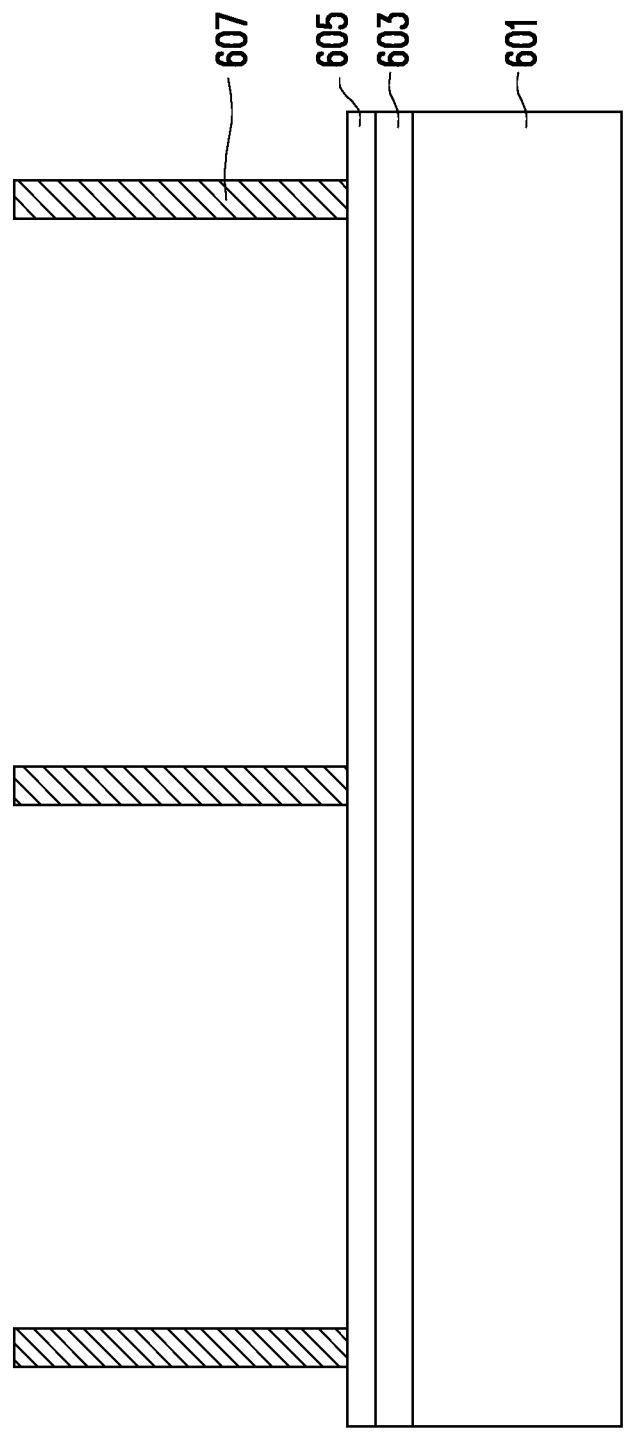
FIG. 6 illustrates a formation of second through interposer vias in accordance with some embodiments.

FIG. 6 illustrates a first carrier substrate 601 with an adhesive layer 603 and a polymer layer 605 over the adhesive layer 603. In an embodiment the first carrier substrate 601 comprises, for example, silicon based materials, such as glass or silicon oxide, or other materials, such as aluminum oxide, combinations of any of these materials, or the like. The first carrier substrate 601 is planar in order to accommodate an attachment of semiconductor devices such as the first package 503 and the second package 505 (not illustrated in FIG. 6 but illustrated and discussed above with respect to FIG. 5).

The adhesive layer 603 is placed on the first carrier substrate 601 in order to assist in the adherence of overlying structures (e.g., the polymer layer 605). In an embodiment the adhesive layer 603 may comprise a light to heat conversion (LTHC) material or an ultra-violet glue, which loses its adhesive properties when exposed to ultra-violet light. However, other types of adhesives, such as pressure sensitive adhesives, radiation curable adhesives, epoxies, combinations of these, or the like, may also be used. The adhesive layer 603 may be placed onto the first carrier substrate 601 in a semi-liquid or gel form, which is readily deformable under pressure.

The polymer layer 605 is placed over the adhesive layer 603 and is utilized in order to provide protection to, e.g., the first package 503 and the second package 505 once the first package 503 and the second package 505 have been attached. In an embodiment the polymer layer 605 may be polybenzoxazole (PBO), although any suitable material, such as polyimide or a polyimide derivative, may alternatively be utilized. The polymer layer 605 may be placed using, e.g., a spin-coating process to a thickness of between about 2 µm and about 15 µm, such as about 5 µm, although any suitable method and thickness may alternatively be used.

A seed layer (not separately illustrated) is formed over the polymer layer 605. The seed layer is a thin layer of a conductive material that aids in the formation of a thicker layer during subsequent processing steps. The seed layer may comprise a layer of titanium about 500 Å thick followed by a layer of copper about 3,000 Å thick. The seed layer may be created using processes such as sputtering, evaporation, or PECVD processes, depending upon the desired materials. The seed layer may be formed to have a thickness of between about 0.3 µm and about 1 µm, such as about 0.5 µm.

Once the seed layer is formed, a photoresist (also not illustrated) is placed and patterned over the seed layer. In an embodiment the photoresist may be placed on the seed layer using, e.g., a dry film lamination process or a spin coating technique to a height of between about 50 µm and about 250 µm, such as about 240 µm. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern.

In an embodiment the pattern formed into the photoresist is a pattern for second TIVs 607. The second TIVs 607 are formed in such a placement as to be located on different sides of subsequently attached devices such as the first package 503 and the second package 505. However, any suitable arrangement for the pattern of second TIVs 607, such as by being located such that the first package 503 and the second package 505 are placed on opposing sides of the second TIVs 607, may alternatively be utilized.

The second TIVs 607 are formed within the photoresist. In an embodiment the second TIVs 607 comprise one or more conductive materials, such as copper, tungsten, other conductive metals, or the like, and may be formed, for example, by electroplating, electroless plating, or the like. In an embodiment, an electroplating process is used wherein the seed layer and the photoresist are submerged or immersed in an electroplating solution. The seed layer surface is electrically connected to the negative side of an external DC power supply such that the seed layer functions as the cathode in the electroplating process. A solid conductive anode, such as a copper anode, is also immersed in the solution and is attached to the positive side of the power supply. The atoms from the anode are dissolved into the solution, from which the cathode, e.g., the seed layer, acquires the dissolved atoms, thereby plating the exposed conductive areas of the seed layer within the opening of the photoresist.

Once the second TIVs 607 have been formed using the photoresist and the seed layer, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may alternatively be utilized. The removal of the photoresist may expose the underlying portions of the seed layer.

Once the second TIVs 607 have been formed, exposed portions of the seed layer are then removed. In an embodiment the exposed portions of the seed layer (e.g., those portions that are not covered by the second TIVs 607) may be removed by, for example, a wet or dry etching process. For example, in a dry etching process reactants may be directed towards the seed layer, using the second TIVs 607 as masks. Alternatively, etchants may be sprayed or otherwise put into contact with the seed layer in order to remove the exposed portions of the seed layer. After the exposed portion of the seed layer has been etched away, a portion of the polymer layer 605 is exposed between the second TIVs 607. The second TIVs 607 may be formed to a height of between about 180 µm and about 200 µm, with a critical dimension of about 190 µm and a pitch of about 300 µm.

Figure 7:
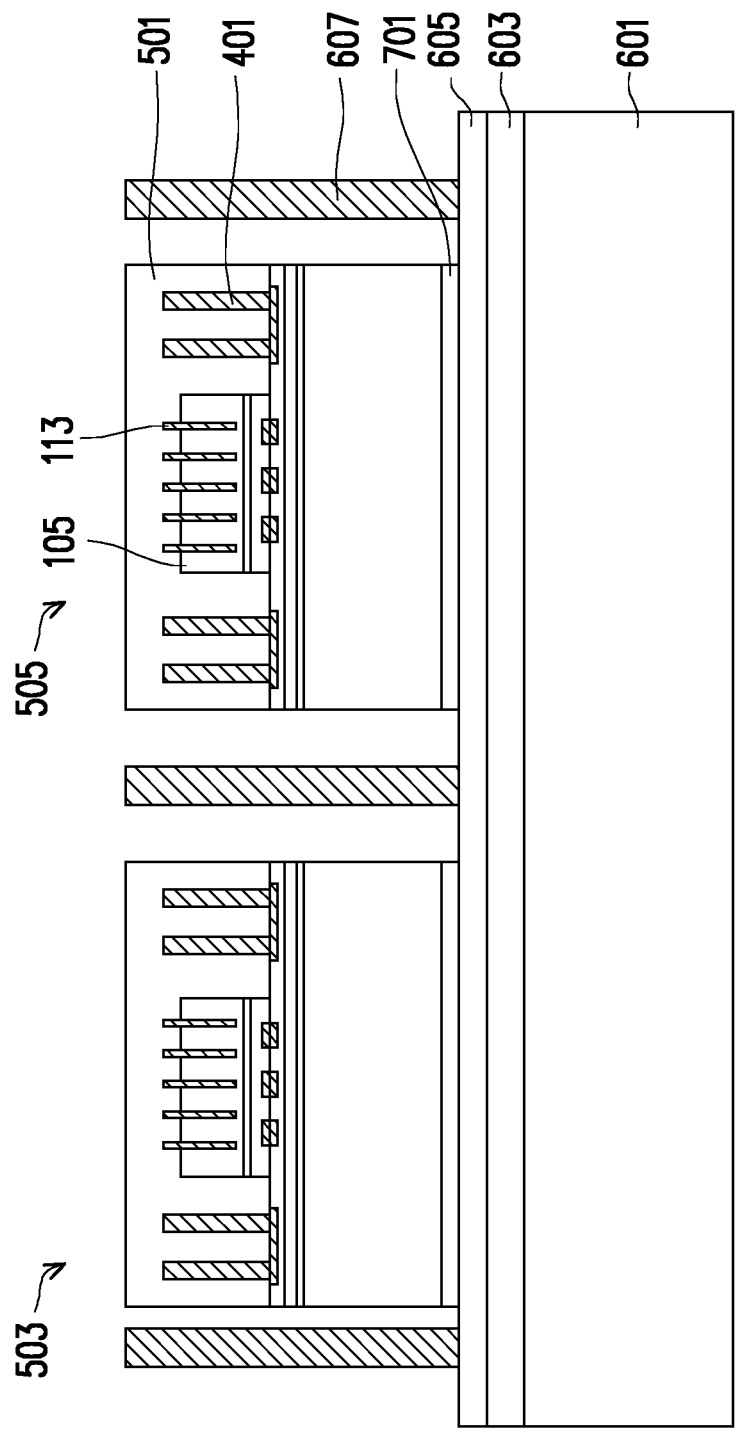
FIG. 7 illustrates a placement of a first package and a second package in accordance with some embodiments.

FIG. 7 illustrates a placement of the first package 503 and the second package 505 onto the polymer layer 605 with, e.g., an adhesive 701. In an embodiment the first package 503 and the second package 505 may be placed using, e.g. a pick and place process. However, any suitable method of placing the first package 503 and the second package 505 may be utilized.

Figure 8:
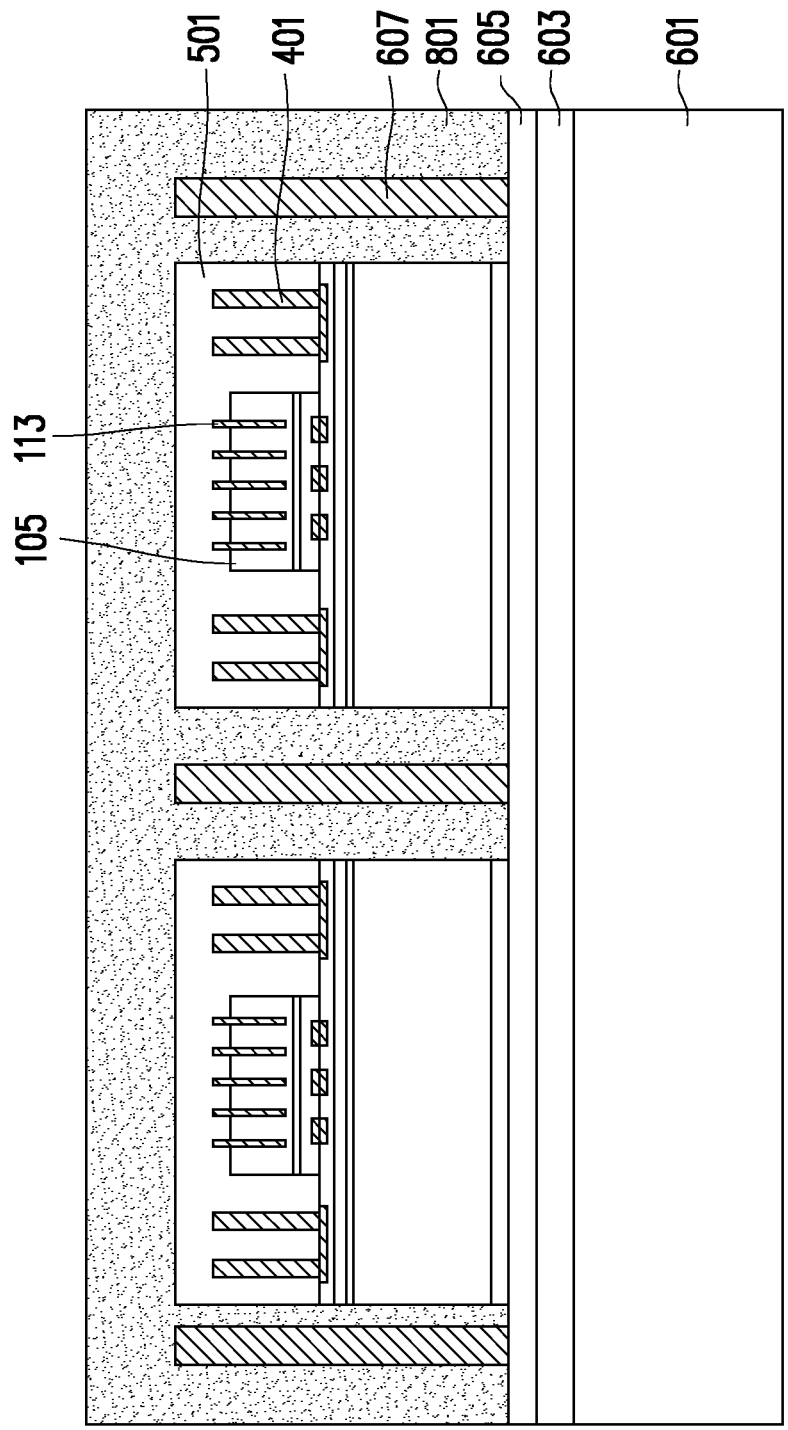
FIG. 8 illustrates an encapsulation with an encapsulant in accordance with some embodiments.

FIG. 8 illustrates an encapsulation of the first package 503 and the second package 505, and the second TIVs 607. The encapsulation may be performed in a molding device (not individually illustrated in FIG. 8), which may comprise a top molding portion and a bottom molding portion separable from the top molding portion. When the top molding portion is lowered to be adjacent to the bottom molding portion, a molding cavity may be formed for the first carrier substrate 601, the second TIVs 607, the first package 503 and the second package 505.

During the encapsulation process the top molding portion may be placed adjacent to the bottom molding portion, thereby enclosing the first carrier substrate 601, the second TIVs 607, the first package 503, and the second package 505 within the molding cavity. Once enclosed, the top molding portion and the bottom molding portion may form an airtight seal in order to control the influx and outflux of gasses from the molding cavity. Once sealed, an encapsulant 801 may be placed within the molding cavity. The encapsulant 801 may be a molding compound resin such as polyimide, PPS, PEEK, PES, a heat resistant crystal resin, combinations of these, or the like. The encapsulant 801 may be placed within the molding cavity prior to the alignment of the top molding portion and the bottom molding portion, or else may be injected into the molding cavity through an injection port.

Once the encapsulant 801 has been placed into the molding cavity such that the encapsulant 801 encapsulates the first carrier substrate 601, the second TIVs 607, the first package 503, and the second package 505, the encapsulant 801 may be cured in order to harden the encapsulant 801 for optimum protection. While the exact curing process is dependent at least in part on the particular material chosen for the encapsulant 801, in an embodiment in which molding compound is chosen as the encapsulant 801, the curing could occur through a process such as heating the encapsulant 801 to between about 100° C. and about 130° C., such as about 125° C. for about 60 sec to about 3000 sec, such as about 600 sec. Additionally, initiators and/or catalysts may be included within the encapsulant 801 to better control the curing process.

However, as one having ordinary skill in the art will recognize, the curing process described above is merely an exemplary process and is not meant to limit the current embodiments. Other curing processes, such as irradiation or even allowing the encapsulant 801 to harden at ambient temperature, may alternatively be used. Any suitable curing process may be used, and all such processes are fully intended to be included within the scope of the embodiments discussed herein.

Figure 9:
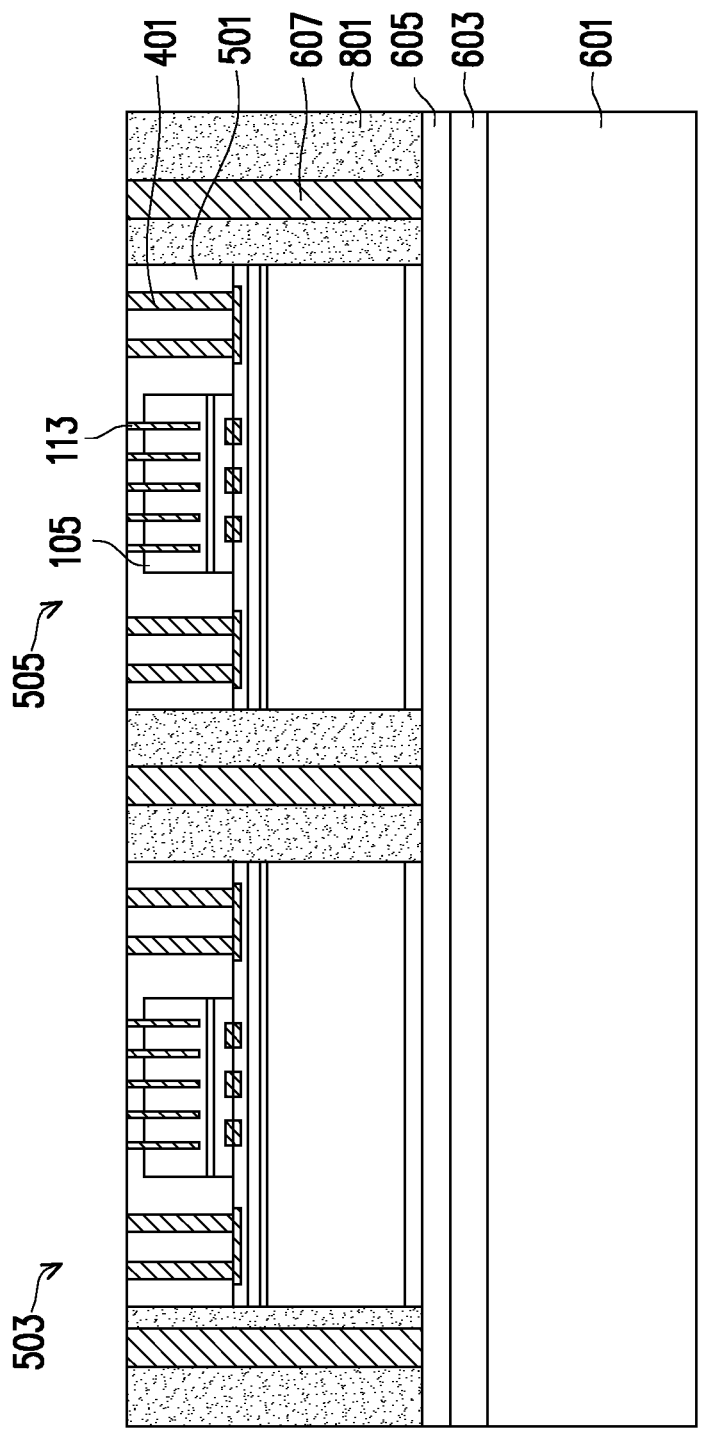
FIG. 9 illustrates a thinning of the encapsulant in accordance with some embodiments.

FIG. 9 illustrates a thinning of the encapsulant 801 in order to expose the second TIVs 607, the first TIVs 401, the first semiconductor device 101, and the second semiconductor device 103 for further processing. The thinning may be performed, e.g., using a mechanical grinding or CMP process whereby chemical etchants and abrasives are utilized to react and grind away the encapsulant 801, the first semiconductor device 101 and the second semiconductor device 103 until the second TIVs 607, the first TIVs 401, and the TSVs 113 have been exposed. As such, the second TIVs 607, the first TIVs 401, and the TSVs 113 may have a planar surface that is also coplanar with the encapsulant 801. In an embodiment the thinning of the encapsulant 801 is continued until the encapsulant has a height of about 160 µm.

However, while the CMP process described above is presented as one illustrative embodiment, it is not intended to be limiting to the embodiments. Any other suitable removal process may alternatively be used to thin the encapsulant 801, the first semiconductor device 101, and the second semiconductor device 103 and expose the TSVs 113. For example, a series of chemical etches may alternatively be utilized. This process and any other suitable process may alternatively be utilized to thin the encapsulant 801, the first semiconductor device 101, and the second semiconductor device 103, and all such processes are fully intended to be included within the scope of the embodiments.

Figure 10:
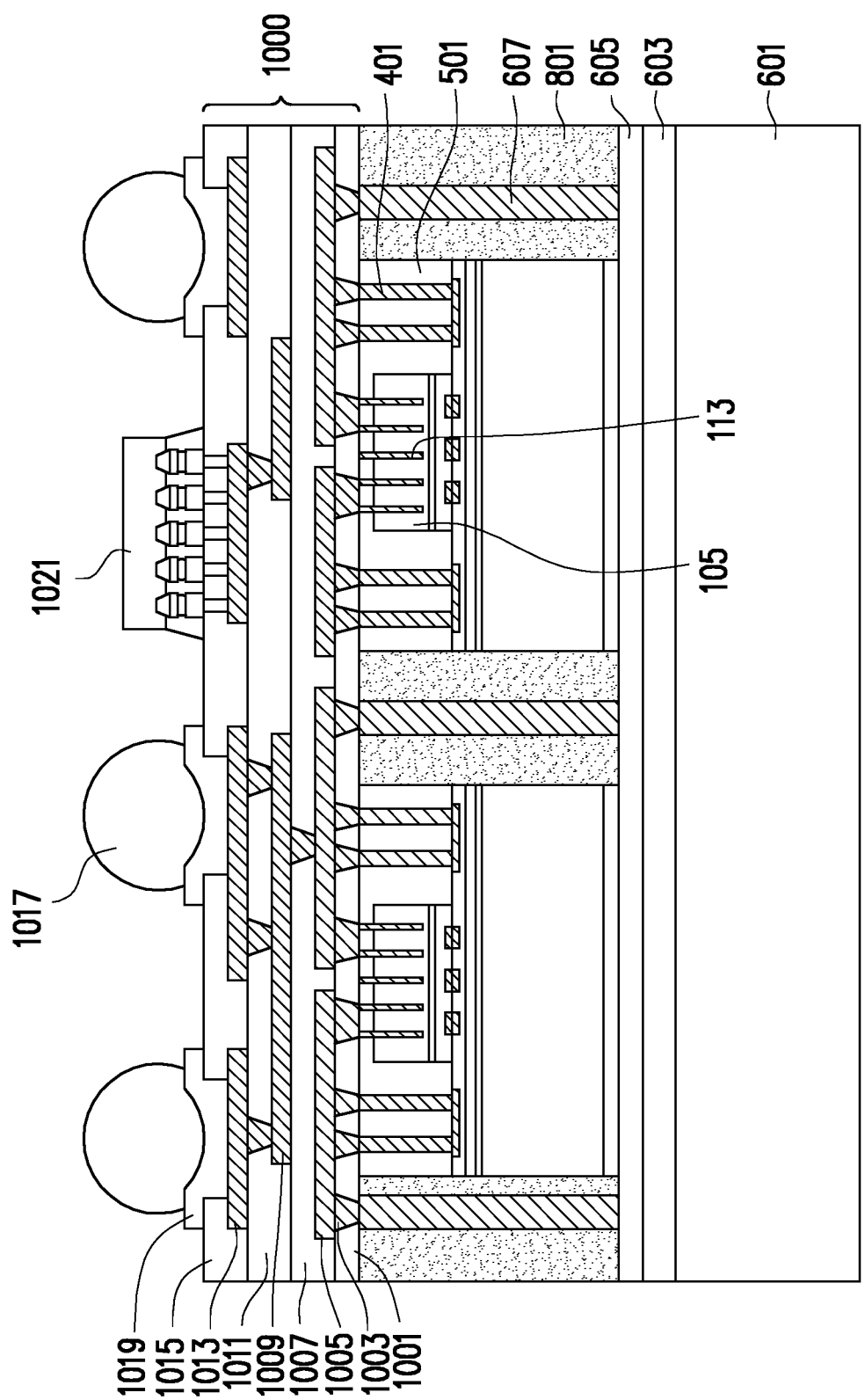
FIG. 10 illustrates a formation of a redistribution structure in accordance with some embodiments.

FIG. 10 illustrates a formation of a redistribution structure 1000 with one or more layers over the encapsulant 801. In an embodiment the redistribution structure 1000 may be formed by initially forming a first redistribution passivation layer 1001 over the encapsulant 801. In an embodiment the first redistribution passivation layer 1001 may be polybenzoxazole (PBO), although any suitable material, such as polyimide or a polyimide derivative, such as a low temperature cured polyimide, may alternatively be utilized. The first redistribution passivation layer 1001 may be placed using, e.g., a spin-coating process to a thickness of between about 5 μm and about 17 μm, such as about 7 μm, although any suitable method and thickness may alternatively be used.

Once the first redistribution passivation layer 1001 has been formed, first redistribution vias 1003 may be formed through the first redistribution passivation layer 1001 in order to make electrical connections to the first semiconductor device 101, the second semiconductor device 103, the first TIVs 401, and the second TIVs 607. In an embodiment the first redistribution vias 1003 may be formed by using, e.g., a damascene process whereby the first redistribution passivation layer 1001 is initially patterned to form openings using, e.g., a photolithographic masking and etching process or, if the material of the first redistribution passivation layer 1001 is photosensitive, exposing and developing the material of the first redistribution passivation layer 1001. Once patterned, the openings are filled with a conductive material such as copper and any excess material is removed using, e.g., a planarization process such as chemical mechanical polishing. However, any suitable process or materials may be utilized.

After the first redistribution vias 1003 have been formed, a first redistribution layer 1005 is formed over and in electrical connection with the first redistribution vias 1003. In an embodiment the first redistribution layer 1005 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the first redistribution layer 1005 is desired to be located.

Once the photoresist has been formed and patterned, a conductive material, such as copper, may be formed on the seed layer through a deposition process such as plating. The conductive material may be formed to have a thickness of between about 1 μm and about 10 μm, such as about 4 μm. However, while the material and methods discussed are suitable to form the conductive material, these materials are merely exemplary. Any other suitable materials, such as AlCu or Au, and any other suitable processes of formation, such as CVD or PVD, may alternatively be used to form the first redistribution layer 1005.

Once the conductive material has been formed, the photoresist may be removed through a suitable removal process such as chemical stripping and/or ashing. Additionally, after the removal of the photoresist, those portions of the seed layer that were covered by the photoresist may be removed through, for example, a suitable etch process using the conductive material as a mask.

Optionally, if desired, after the first redistribution layer 1005 has been formed, a surface treatment of the first redistribution layer 1005 may be performed in order to help protect the first redistribution layer 1005. In an embodiment the surface treatment may be a descum treatment such as a plasma treatment wherein the surface of the first redistribution layer 1005 is exposed to a plasma of, e.g., argon, nitrogen, oxygen or a mixed $Ar/N_2/O_2$ ambient environment in order to improve the interface adhesion between the first redistribution layer 1005 and overlying layers (e.g., the second redistribution passivation layer 1007). However, any suitable surface treatment may be utilized.

After the first redistribution layer 1005 has been formed, a second redistribution passivation layer 1007 may be formed and patterned to help isolate the first redistribution layer 1005. In an embodiment the second redistribution passivation layer 1007 may be similar to the first redistribution passivation layer 1001, such as by being a positive tone PBO, or may be different from the first redistribution passivation layer 1001, such as by being a negative tone material such as a low-temperature cured polyimide. The second redistribution passivation layer 1007 may be placed to a thickness of about 7 μm. Once in place, the second redistribution passivation layer 1007 may be patterned to form openings using, e.g., a photolithographic masking and etching process or, if the material of the second redistribution passivation layer 1007 is photosensitive, exposing and developing the material of the second redistribution passivation layer 1007. However, any suitable material and method of patterning maybe utilized.

After the second redistribution passivation layer 1007 has been patterned, a second redistribution layer 1009 may be formed to extend through the openings formed within the second redistribution passivation layer 1007 and make electrical connection with the first redistribution layer 1005. In an embodiment the second redistribution layer 1009 may be formed using materials and processes similar to the first redistribution layer 1005. For example, a seed layer may be applied and covered by a patterned photoresist, a conductive material such as copper may be applied onto the seed layer, the patterned photoresist may be removed, and the seed layer may be etched using the conductive material as a mask. In an embodiment the second redistribution layer 1009 is formed to a thickness of about 4 μm. However, any suitable material or process of manufacture may be used.

After the second redistribution layer 1009 has been formed, a third redistribution passivation layer 1011 is applied over the second redistribution layer 1009 in order to help isolate and protect the second redistribution layer 1009. In an embodiment the third redistribution passivation layer 1011 may be formed of similar materials and in a similar fashion as the second redistribution passivation layer 1007 to a thickness of about 7 μm. For example, the third redistribution passivation layer 1011 may be formed of PBO or a low-temperature cured polyimide that has been applied and patterned as described above with respect to the second redistribution passivation layer 1007. However, any suitable material or process of manufacture may be utilized.

After the third redistribution passivation layer 1011 has been patterned, a third redistribution layer 1013 may be formed to extend through the openings formed within the third redistribution passivation layer 1011 and make electrical connection with the second redistribution layer 1009. In an embodiment the third redistribution layer 1013 may be formed using materials and processes similar to the first redistribution layer 1005. For example, a seed layer may be applied and covered by a patterned photoresist, a conductive material such as copper may be applied onto the seed layer, the patterned photoresist may be removed, and the seed layer may be etched using the conductive material as a mask. In an embodiment the third redistribution layer 1013 is formed to a thickness of 5 µm. However, any suitable material or process of manufacture may be used.

After the third redistribution layer 1013 has been formed, a fourth redistribution passivation layer 1015 may be formed over the third redistribution layer 1013 in order to help isolate and protect the third redistribution layer 1013. In an embodiment the fourth redistribution passivation layer 1015 may be formed of similar materials and in a similar fashion as the second redistribution passivation layer 1007. For example, the fourth redistribution passivation layer 1015 may be formed of PBO or a low-temperature cured polyimide that has been applied and patterned as described above with respect to the second redistribution passivation layer 1007. In an embodiment the fourth redistribution passivation layer 1015 is formed to a thickness of about 8 µm. However, any suitable material or process of manufacture may be utilized.

FIG. 10 additionally illustrates a formation of underbump metallizations 1019 and third external connectors 1017 to make electrical contact with the third redistribution layer 1013. In an embodiment the underbump metallizations 1019 may each comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the underbump metallizations 1019. Any suitable materials or layers of material that may be used for the underbump metallizations 1019 are fully intended to be included within the scope of the embodiments.

In an embodiment the underbump metallizations 1019 are created by forming each layer over the third redistribution layer 1013 and along the interior of the openings through the fourth redistribution passivation layer 1015. The forming of each layer may be performed using a plating process, such as electrochemical plating, although other processes of formation, such as sputtering, evaporation, or PECVD process, may be used depending upon the desired materials. The underbump metallizations 1019 may be formed to have a thickness of between about 0.7 µm and about 10 µm, such as about 5 µm.

In an embodiment the third external connectors 1017 may be placed on the underbump metallizations 1019 and may be a ball grid array (BGA) which comprises a eutectic material such as solder, although any suitable materials may alternatively be used. In an embodiment in which the third external connectors 1017 are solder balls, the third external connectors 1017 may be formed using a ball drop method, such as a direct ball drop process. In another embodiment, the solder balls may be formed by initially forming a layer of tin through any suitable method such as evaporation, electroplating, printing, solder transfer, and then performing a reflow in order to shape the material into the desired bump shape. Once the third external connectors 1017 have been formed, a test may be performed to ensure that the structure is suitable for further processing.

Additionally, a surface device 1021 may also be placed in contact with the third redistribution layer 1013 through the underbump metallizations 1019. The surface device 1021 may be used to provide additional functionality or programming to the first package 503, the second package 505, or the package as a whole. In an embodiment the surface device 1021 may be a surface mount device (SMD) or an integrated passive device (IPD) that comprises passive devices such as resistors, inductors, capacitors, jumpers, combinations of these, or the like that are desired to be connected to and utilized in conjunction with the first package 503 or the second package 505, or other parts of the package.

The surface device 1021 may be connected to the underbump metallizations 1019, for example, by sequentially dipping connectors such as solder balls of the surface device 1021 into flux, and then using a pick-and-place tool in order to physically align the connectors of the surface device 1021 with individual ones of the underbump metallizations 1019. In an embodiment in which the surface device 1021 uses connectors such as solder balls, once the surface device 1021 has been placed a reflow process may be performed in order to physically bond the surface device 1021 with the underlying underbump metallizations 1019 and a flux clean may be performed. However, any other suitable connector or connection process may be utilized, such as metal-to-metal bonding or the like. Once bonded, an underfill material may be applied.

Figure 11:
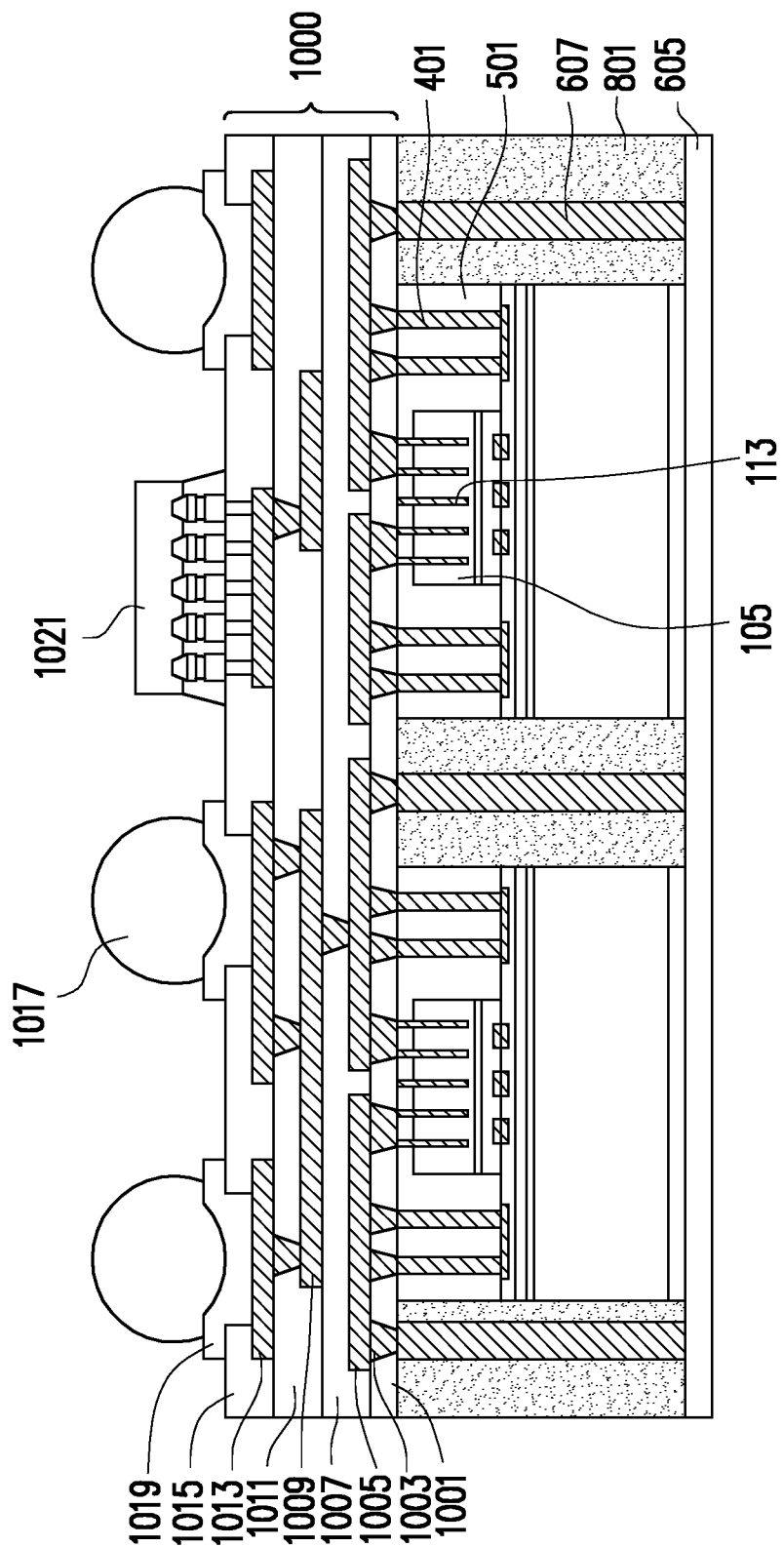
FIG. 11 illustrates a removal of a carrier in accordance with some embodiments.

FIG. 11 illustrates a debonding of the first carrier substrate 601 from the first package 503 and the second package 505. In an embodiment the third external connectors 1017 and, hence, the structure including the first semiconductor device 101 and the second semiconductor device 103, may be attached to a ring structure (not separately illustrated in FIG. 11). The ring structure may be a metal ring intended to provide support and stability for the structure during and after the debonding process. In an embodiment the third external connectors 1017 are attached to the ring structure using, e.g., an ultraviolet tape (also not illustrated in FIG. 11), although any other suitable adhesive or attachment may alternatively be used.

Once the third external connectors 1017 and, hence, the structure including the first semiconductor device 101 and the second semiconductor device 103 are attached to the ring structure, the first carrier substrate 601 may be debonded from the structure including the first semiconductor device 101 and the second semiconductor device 103 using, e.g., a thermal process to alter the adhesive properties of the adhesive layer 603. In a particular embodiment an energy source such as an ultraviolet (UV) laser, a carbon dioxide ($CO_2$) laser, or an infrared (IR) laser, is utilized to irradiate and heat the adhesive layer 603 until the adhesive layer 603 loses at least some of its adhesive properties. Once performed, the first carrier substrate 601 and the adhesive layer 603 may be physically separated and removed from the structure comprising the third external connectors 1017, the first semiconductor device 101, and the second semiconductor device 103.

However, while a ring structure may be used to support the third external connectors 1017, such a description is merely one method that may be used and is not intended to be limiting upon the embodiments. In another embodiment the third external connectors 1017 may be attached to a second carrier substrate using, e.g., a first glue. In an embodiment the second carrier substrate is similar to the first carrier substrate 601, although it may also be different. Once attached, the adhesive layer 603 may be irradiated and the adhesive layer 603 and the first carrier substrate 601 may be physically removed.

Figure 12A:
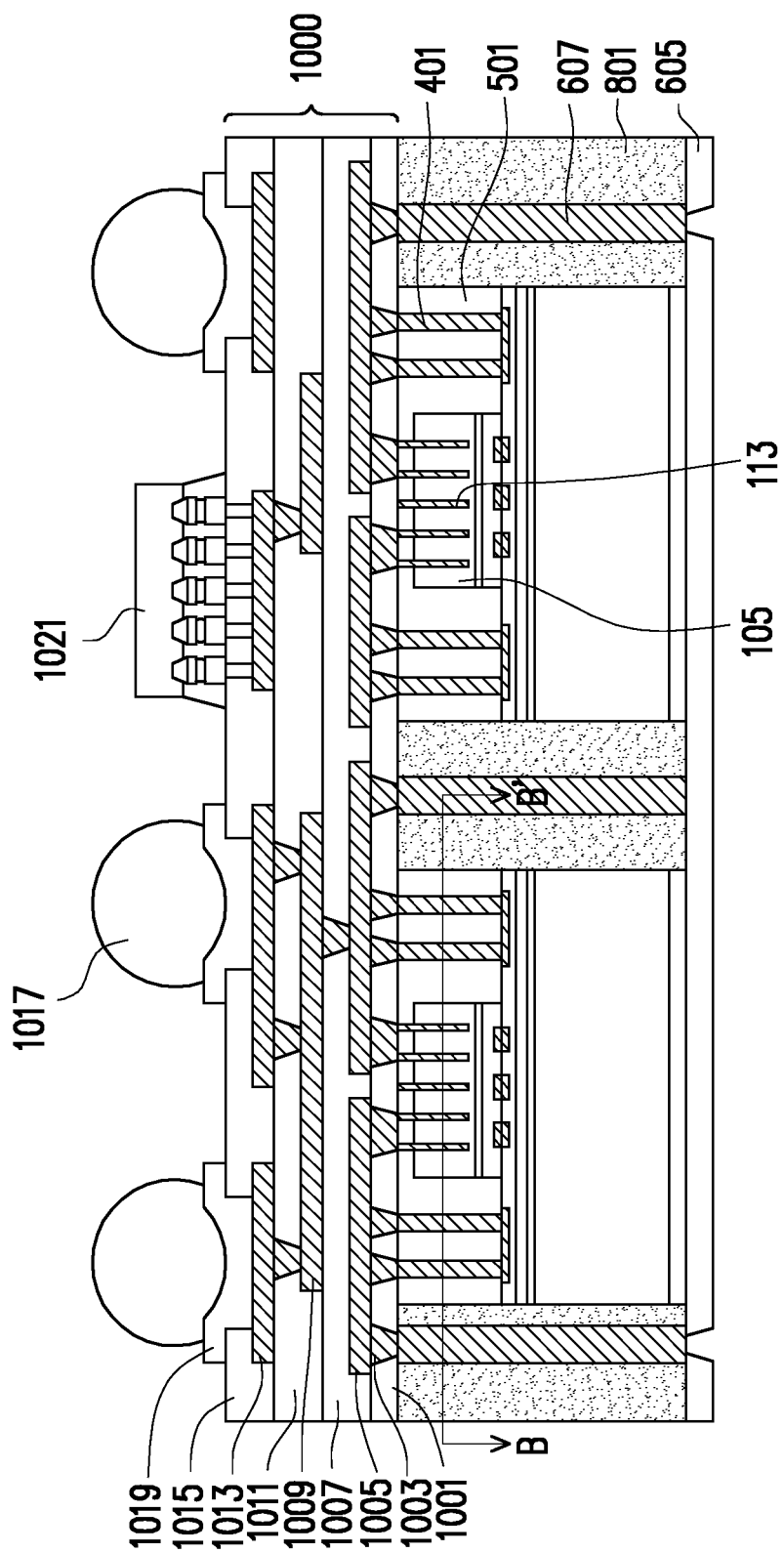
FIGS. 12A-12B illustrate a patterning of a polymer layer in accordance with some embodiments.
Figure 12B:
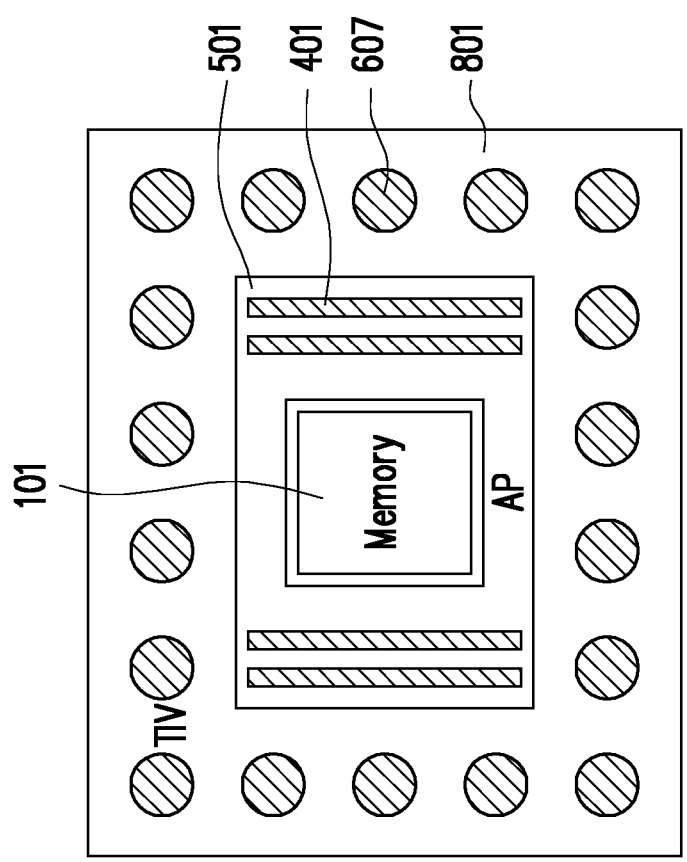

FIGS. 12A-12B illustrate a patterning of the polymer layer 605 in order to expose the second TIVs 607. In an embodiment the polymer layer 605 may be patterned using, e.g., a laser drilling method. In such a method a protective layer, such as a light-to-heat conversion (LTHC) layer or a hogomax layer (not separately illustrated in FIG. 12A) is first deposited over the polymer layer 605. Once protected, a laser is directed towards those portions of the polymer layer 605 which are desired to be removed in order to expose the underlying second TIVs 607. During the laser drilling process the drill energy may be in a range from 0.1 mJ to about 30 mJ, and a drill angle of about 0 degree (perpendicular to the polymer layer 605) to about 85 degrees to normal of the polymer layer 605. In an embodiment the patterning may be formed to form openings over the second TIVs 607 to have a width of between about 100 µm and about 300 µm, such as about 200 µm.

In another embodiment, the polymer layer 605 may be patterned by initially applying a photoresist (not individually illustrated in FIG. 12A) to the polymer layer 605 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 605 are removed with, e.g., a dry etch process. However, any other suitable method for patterning the polymer layer 605 may be utilized.

FIG. 12B illustrates a top down view of the structure of FIG. 12A through line B-B' in FIG. 12A. As can be seen, in this embodiment the first TIVs 401 are in the shape of through interposer fins and are located on opposite sides of the first semiconductor device 101. Additionally, the encapsulant 801 encapsulates both the first semiconductor device 101 as well as the second TIVs 607.

Figure 13:
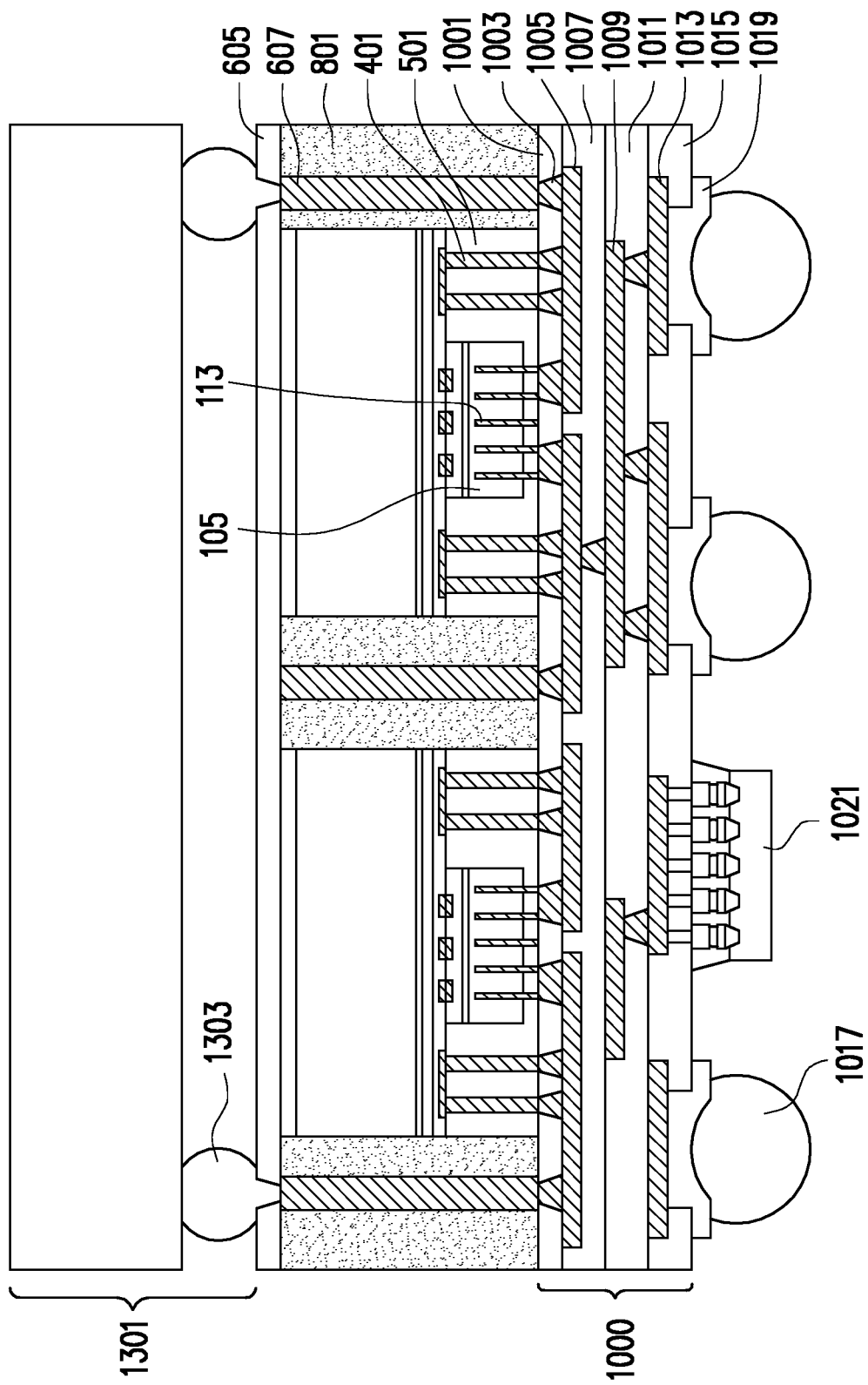
FIG. 13 illustrates a bonding of a third package in accordance with some embodiments.

FIG. 13 illustrates a bonding of a third package 1301 with the second TIVs 607 through the polymer layer 605. In an embodiment the third package 1301 may comprise a third substrate, a third semiconductor device, a fourth semiconductor device (bonded to the third semiconductor device), a second encapsulant, and fourth external connections 1303. In an embodiment the third substrate may be, e.g., a packaging substrate comprising internal interconnects (e.g., through substrate vias) to connect the third semiconductor device and the fourth semiconductor device to the second TIVs 607.

In another embodiment, the third substrate may be an interposer used as an intermediate substrate to connect the third semiconductor device and the fourth semiconductor device to the second TIVs 607. In this embodiment the third substrate may be, e.g., a silicon substrate, doped or undoped, or an active layer of a silicon-on-insulator (SOI) substrate. However, the third substrate may also be a glass substrate, a ceramic substrate, a polymer substrate, or any other substrate that may provide a suitable protection and/or interconnection functionality. These and any other suitable materials may be used for the third substrate.

The third semiconductor device may be a semiconductor device designed for an intended purpose such as being a memory die (e.g., a DRAM die), a logic die, a central processing unit (CPU) die, combinations of these, or the like. In an embodiment the third semiconductor device comprises integrated circuit devices, such as transistors, capacitors, inductors, resistors, first metallization layers (not shown), and the like, therein, as desired for a particular functionality. In an embodiment the third semiconductor device is designed and manufactured to work in conjunction with or concurrently with the first semiconductor device 101 and the second semiconductor device 103.

The fourth semiconductor device may be similar to the third semiconductor device. For example, the fourth semiconductor device may be a semiconductor device designed for an intended purpose (e.g., a DRAM die) and comprising integrated circuit devices for a desired functionality. In an embodiment the fourth semiconductor device is designed to work in conjunction with or concurrently with the first semiconductor device 101, the second semiconductor device 103, and/or the third semiconductor device. However, any suitable functionality may be utilized.

The fourth semiconductor device may be bonded to the third semiconductor device. In an embodiment the fourth semiconductor device is only physically bonded with the third semiconductor device, such as by using an adhesive. In this embodiment the fourth semiconductor device and the third semiconductor device may be electrically connected to the third substrate using, e.g., wire bonds, although any suitable electrical bonding may be alternatively be utilized.

Alternatively, the fourth semiconductor device may be bonded to the third semiconductor device both physically and electrically. In this embodiment the fourth semiconductor device may comprise fifth external connections (not separately illustrated in FIG. 13) that connect with sixth external connections (also not separately illustrated in FIG. 13) on the third semiconductor device in order to interconnect the fourth semiconductor device with the third semiconductor device.

The second encapsulant may be used to encapsulate and protect the third semiconductor device, the fourth semiconductor device, and the third substrate. In an embodiment the second encapsulant may be a molding compound and may be placed as described above with respect to the encapsulant 801. For example, the third semiconductor device, the fourth semiconductor device and the third substrate may be placed into a molding device along with the second encapsulant. However, any suitable method of encapsulating the third semiconductor device, the fourth semiconductor device, and the third substrate may be utilized.

In an embodiment the fourth external connections 1303 may be formed to provide an external connection between the third substrate and, e.g., the second TIVs 607. The fourth external connections 1303 may be contact bumps such as microbumps or controlled collapse chip connection (C4) bumps and may comprise a material such as tin, or other suitable materials, such as silver or copper. In an embodiment in which the fourth external connections 1303 are tin solder bumps, the fourth external connections 1303 may be formed by initially forming a layer of tin through any suitable method such as evaporation, electroplating, printing, solder transfer, ball placement, etc, to a thickness of, e.g., about 100 µm. Once a layer of tin has been formed on the structure, a reflow is performed in order to shape the material into the desired bump shape.

Once the fourth external connections 1303 have been formed, the fourth external connections 1303 are aligned with and placed over the second TIVs 607, and a bonding is performed. For example, in an embodiment in which the fourth external connections 1303 are solder bumps, the bonding process may comprise a reflow process whereby the temperature of the fourth external connections 1303 is raised to a point where the fourth external connections 1303 will liquefy and flow, thereby bonding the third package 1301 to the second TIVs 607 once the fourth external connections 1303 resolidifies.

By utilizing the embodiments described herein, a low cost system-in-package (SiP) solution may be achieved with the integrated fan out process. This solution can integrate all functional chips by implementing chip-to-wafer known good dies for a chip on wafer level package. This system also provides solutions for heterogeneous, homogenous, and multi-chip stacks while still allowing for a flexible chip size integration. For example, only known good dies, splits or partition chips can be utilized to save costs, while still providing for good thermal dissipation and enhancing the signal transmission performance. Additionally, chip to wafer or wafer to wafer bonding processes can be implemented.

Figure 14:
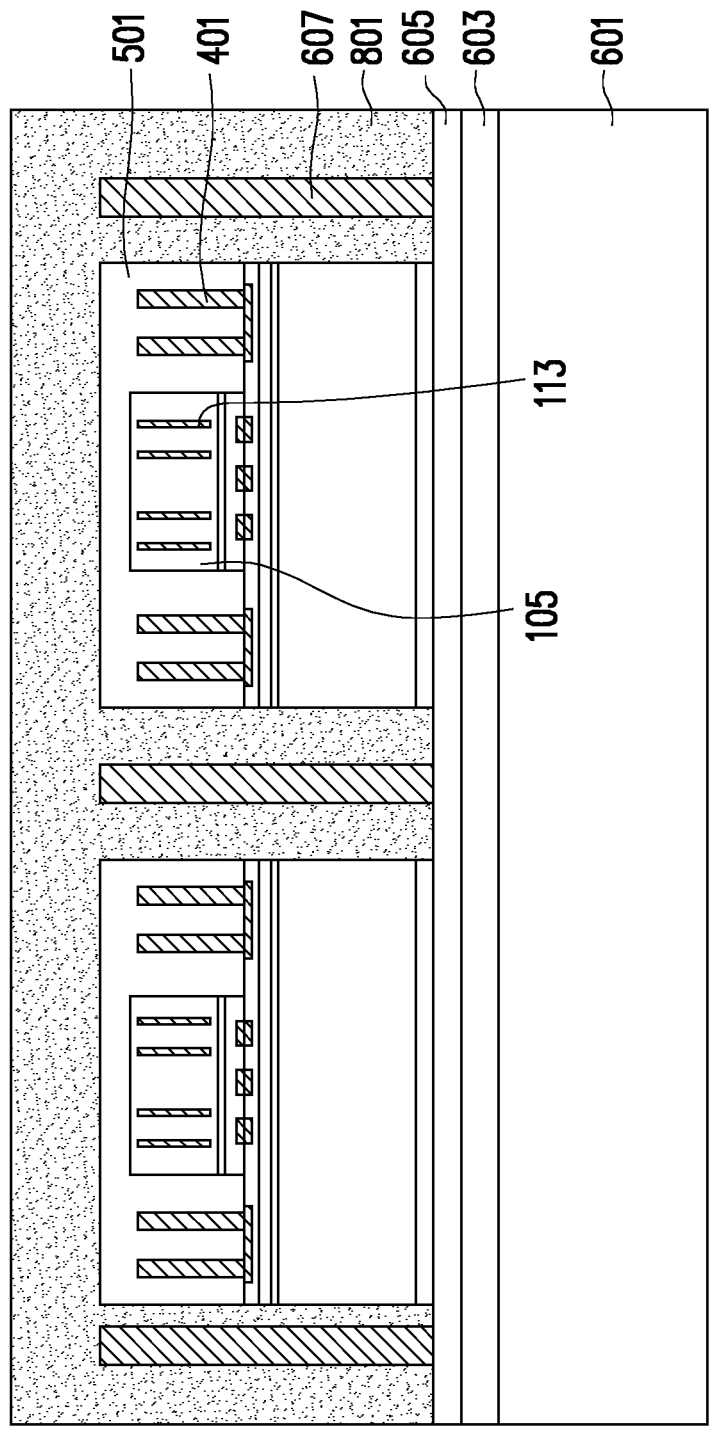
FIGS. 14-18 illustrate another embodiment in which the substrate is recessed after encapsulation in accordance with some embodiments.

FIGS. 14-18 illustrate another embodiment in which the recessing of the first substrates 105 within the first semiconductor device 101 and the second semiconductor device 103 (described above with respect to FIG. 5) is delayed until later during the process. With respect to FIG. 14, the steps as described above with respect to FIG. 1-7 are the same except for the changes described herein. In a first embodiment the thinning of the first substrates 105 (described above with respect to FIG. 3) is performed such that the first substrates 105 do not expose the TSVs 113 within the first substrates 105. For example, the thinning may be performed such that the first semiconductor device 101 and the second semiconductor device 103 have a thickness of about 30 μm, although any suitable thickness may be utilized. FIG. 14 additionally illustrates that, once the thinning has been performed, the rest of the process may be continued and the encapsulant 801 may be placed around the first package 503, the second package 505, and the second TIVs 607.

Figure 15:
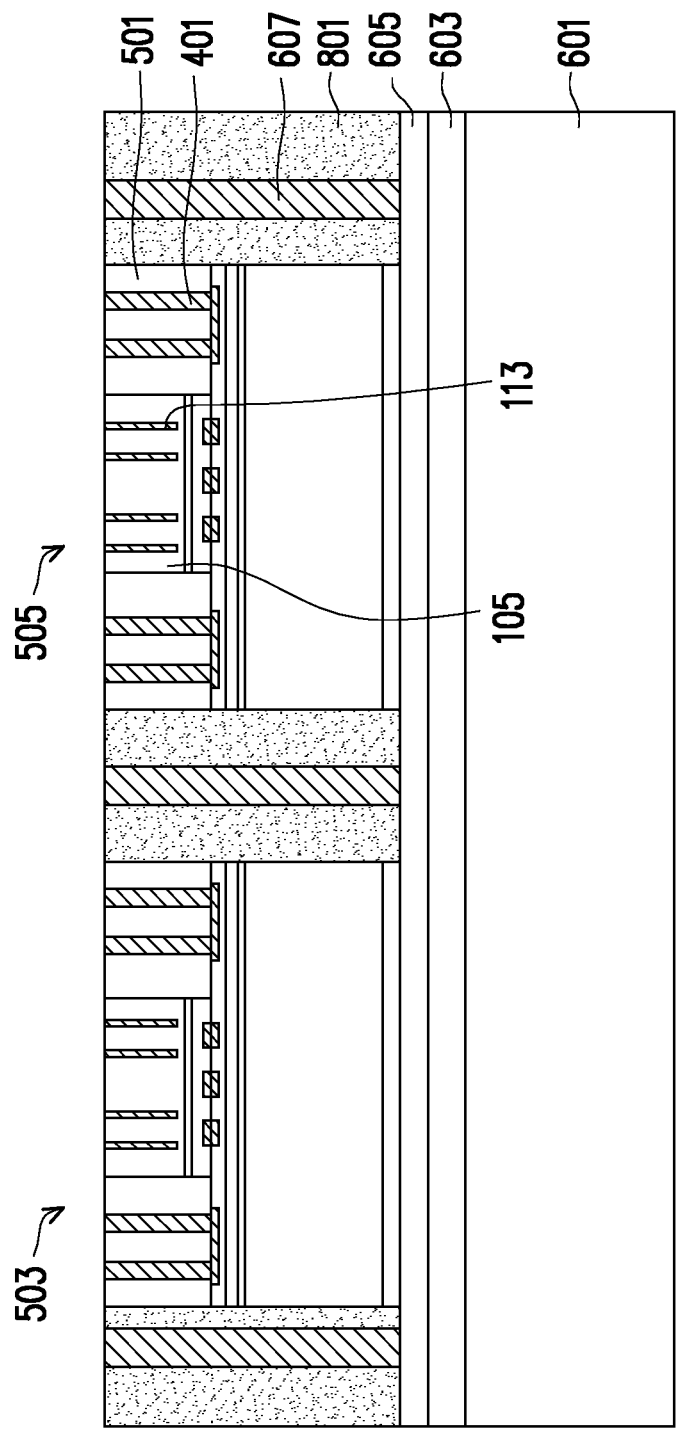

FIG. 15 illustrates that, once the encapsulant 801 has been placed, the encapsulant 801 is thinned in order to expose the second TIVs 607 and the first TIVs 401 while also exposing the TSVs 113 within the first semiconductor device 101 and the second semiconductor device 103. The thinning may be performed, e.g., using a mechanical grinding or CMP process whereby chemical etchants and abrasives are utilized to react and grind away the encapsulant 801, the first semiconductor device 101 and the second semiconductor device 103 until the second TIVs 607, the first TIVs 401, and the TSVs 113 have been exposed. As such, the second TIVs 607, the first TIVs 401, and the TSVs 113 may have a planar surface that is also coplanar with the encapsulant 801.

Figure 16:
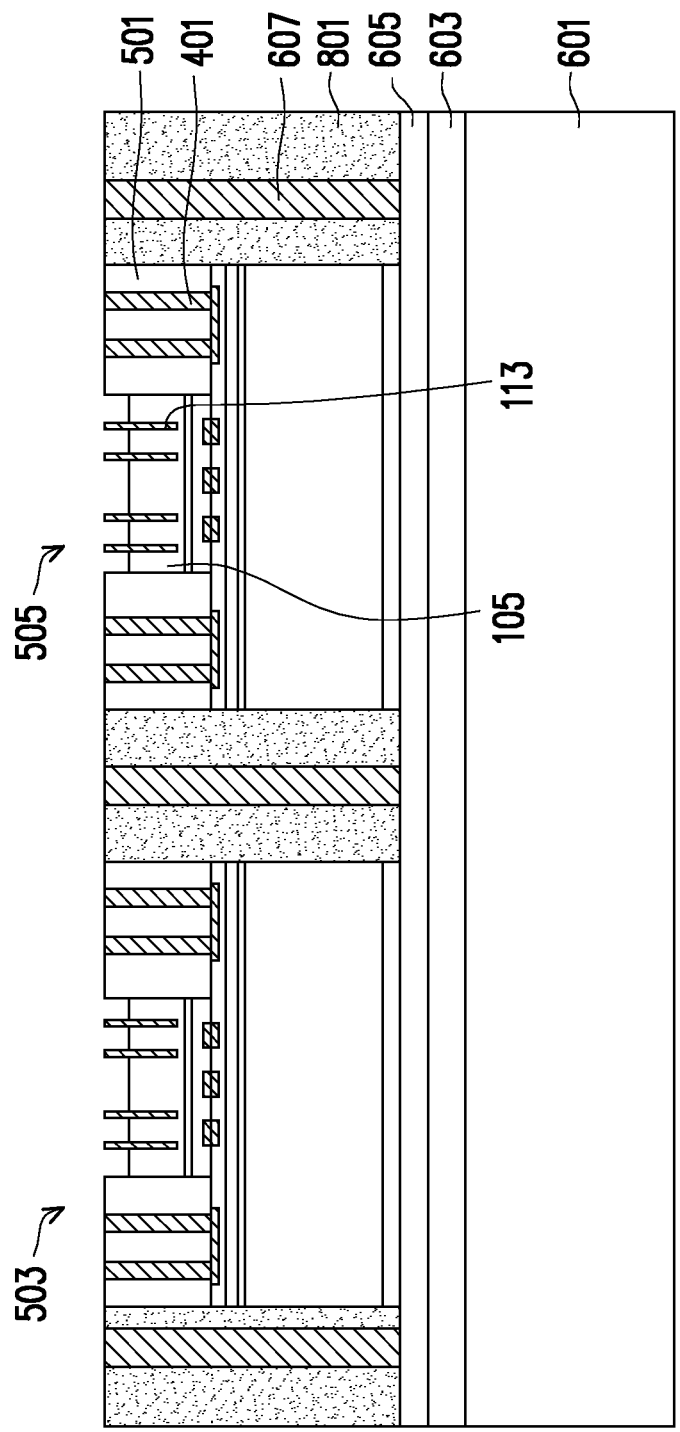

FIG. 16 illustrates a recessing of the first substrates 105 after the thinning of the encapsulant 801. In an embodiment the recessing of the first substrate 105 may be performed as described above with respect to FIG. 5, such as by utilizing a wet or dry etching process to remove portions of the first substrate 105 such that the TSVs 113 extend away from the first substrates 105. Additionally, the etchants utilized for the recessing may be selective to the material of the first substrate 105 such that a minimal amount or none of the surrounding materials, such as the dielectric material 501, is removed. As such, a recess is formed within the dielectric material 501 to a depth of between about 0.5 μm and about 5 μm, such as about 2 μm, wherein the TSVs 113 extend into the recess within the dielectric material 501.

Figure 17:
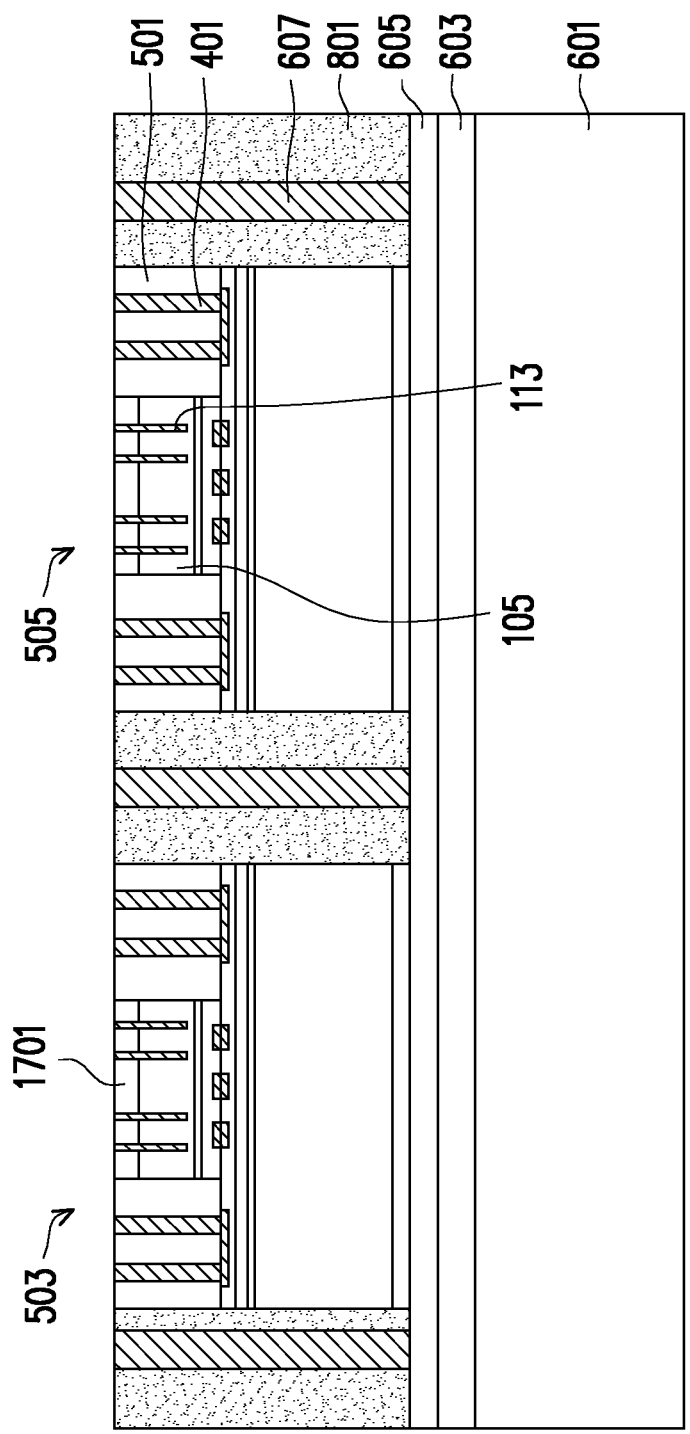

FIG. 17 illustrates a placement of a second dielectric material 1701 within the recess and over the TSVs 113. In an embodiment the second dielectric material 1701 may be similar to the dielectric material 501, such as by being a low temperature cured polyimide material, although any suitable material may be utilized. Once the second dielectric material 1701 has been placed using, e.g., a spin coating process, the second dielectric material 1701, similar to the dielectric material 501, may be cured.

FIG. 17 additionally illustrates that, once the second dielectric material 1701 has been placed and cured, the second dielectric material 1701 is planarized in order to expose the TSVs 113. In an embodiment the second dielectric material 1701 is planarized using a chemical mechanical polishing process, although any suitable planarization process may be utilized. By planarizing the second dielectric material 1701, the second dielectric material 1701 is coplanar with the TSVs 113, the encapsulant 801, the first TIVs 401, and the second TIVs 607.

Figure 18:
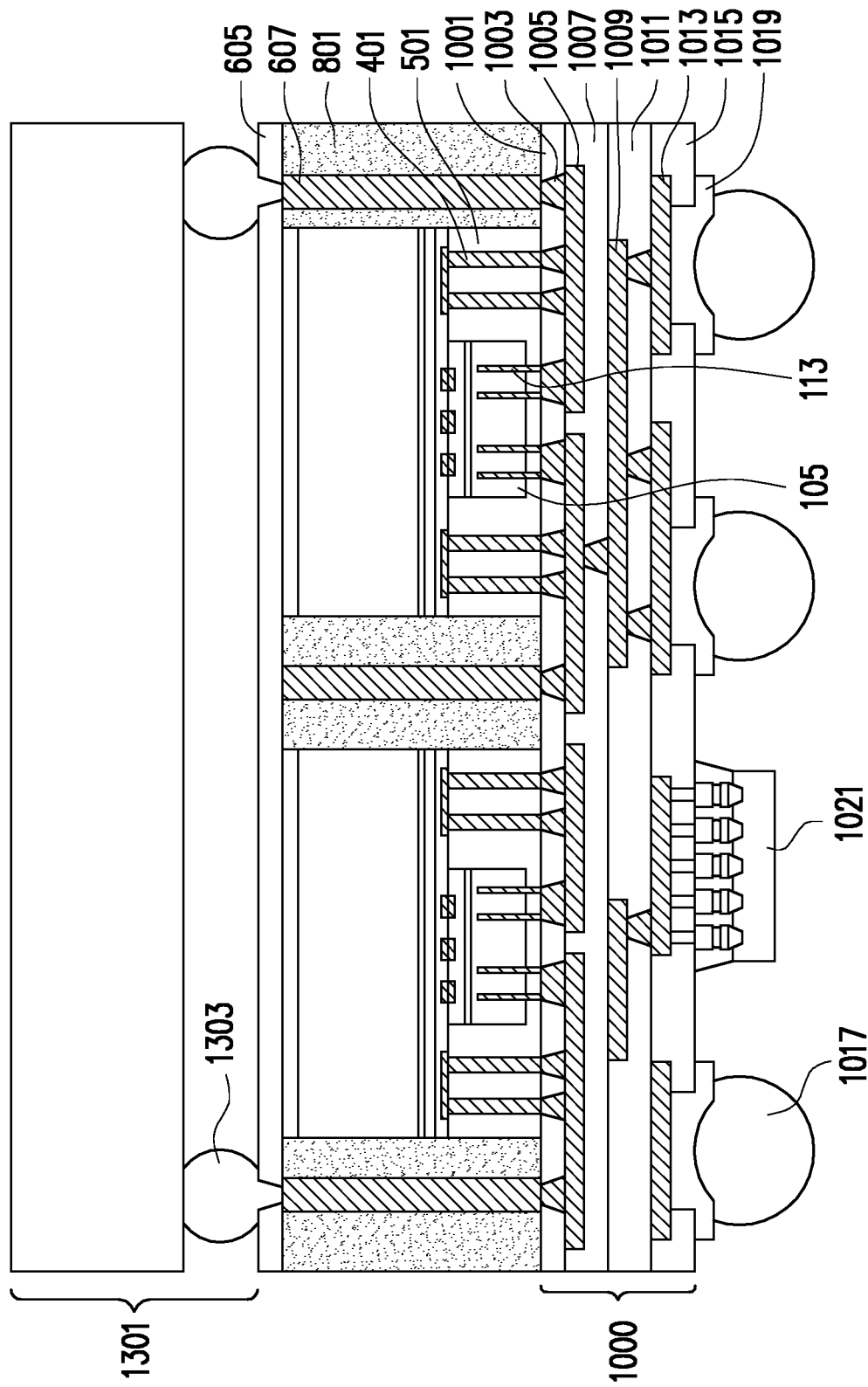
Figure 19:
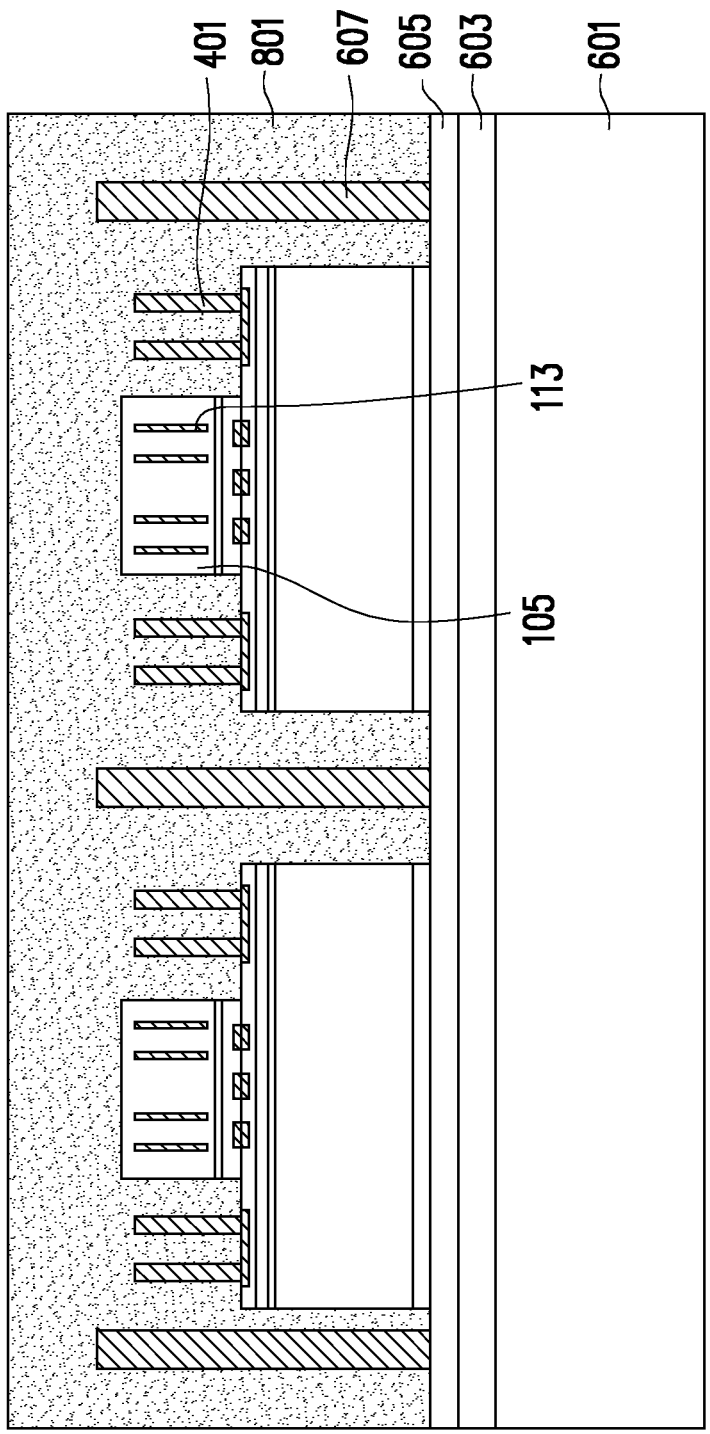
FIGS. 19-23 illustrate another embodiment in which the encapsulant is in contact with the first through interposer vias in accordance with some embodiments.

FIG. 18 illustrates that, once the second dielectric material 1701 is planarized and the first TIVs 401 exposed, the remainder of the steps as described above with respect to FIGS. 10-14 may be performed. For example, the redistribution structure 1000 may be formed, the fourth external connections 1303 are placed, and the third package 1301 may be bonded. However, any suitable steps may be performed.

FIGS. 19-22 illustrate another embodiment in which the recessing of the first substrates 105 are delayed until after the encapsulation. In this embodiment, however, the application of the dielectric material 501 is also not performed prior to the application of the encapsulant 801. Looking first at FIG. 19, the steps as described above with respect to FIG. 14-18 are the same, except the dielectric material 501 is not applied by this point in the process. As such, when the first package 503 and the second package 505 are placed onto the polymer layer 605, the first TIVs 401 remain exposed and the TSVs 113 are not exposed. Additionally, when the encapsulant 801 is applied (as described above with respect to FIG. 8), the encapsulant 801 will be in physical contact with both the first TIVs 401 and the second TIVs 607. In particular, as the encapsulant 801 is placed into the molding chamber, the encapsulant 801 will flow between the second TIVs 607, the first semiconductor device 101 and the second semiconductor device 103.

Figure 20:
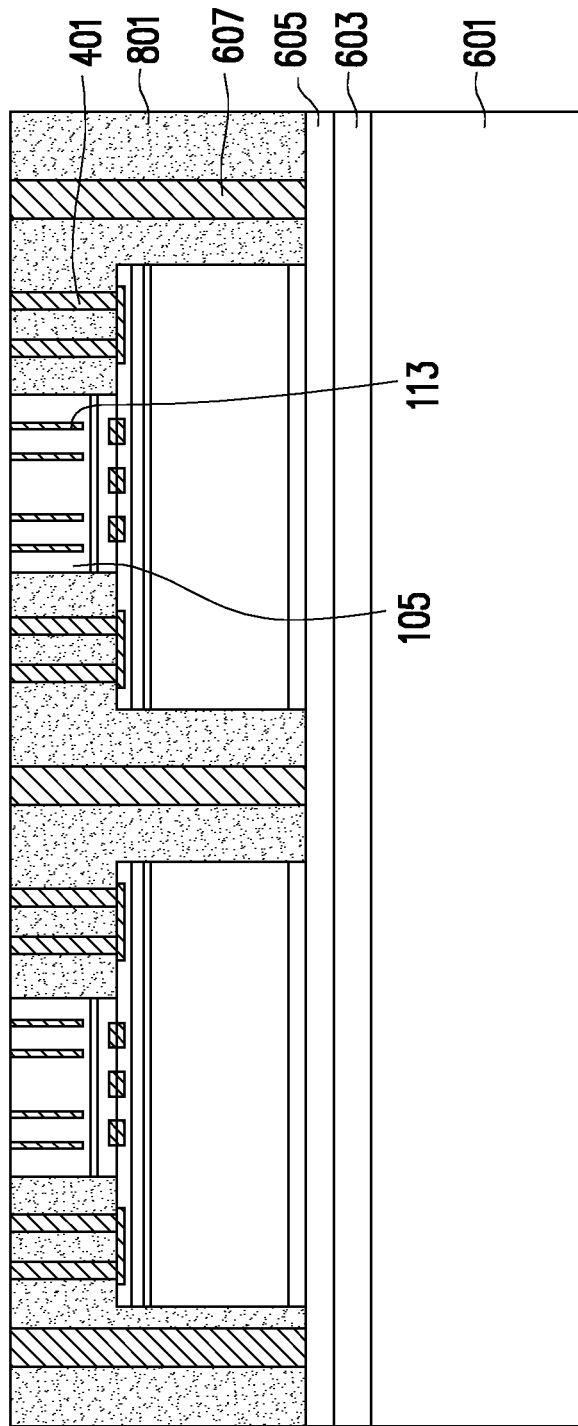

FIG. 20 illustrates a thinning of the encapsulant 801 in order to expose the second TIVs 607 and the first TIVs 401 while also exposing the TSVs 113 within the first semiconductor device 101 and the second semiconductor device 103. The thinning may be performed, e.g., using a mechanical grinding or CMP process whereby chemical etchants and abrasives are utilized to react and grind away the encapsulant 801, the first semiconductor device 101 and the second semiconductor device 103 until the second TIVs 607, the first TIVs 401, and the TSVs 113 have been exposed. As such, the second TIVs 607, the first TIVs 401, and the TSVs 113 may have a planar surface that is also coplanar with the encapsulant 801.

Figure 21:
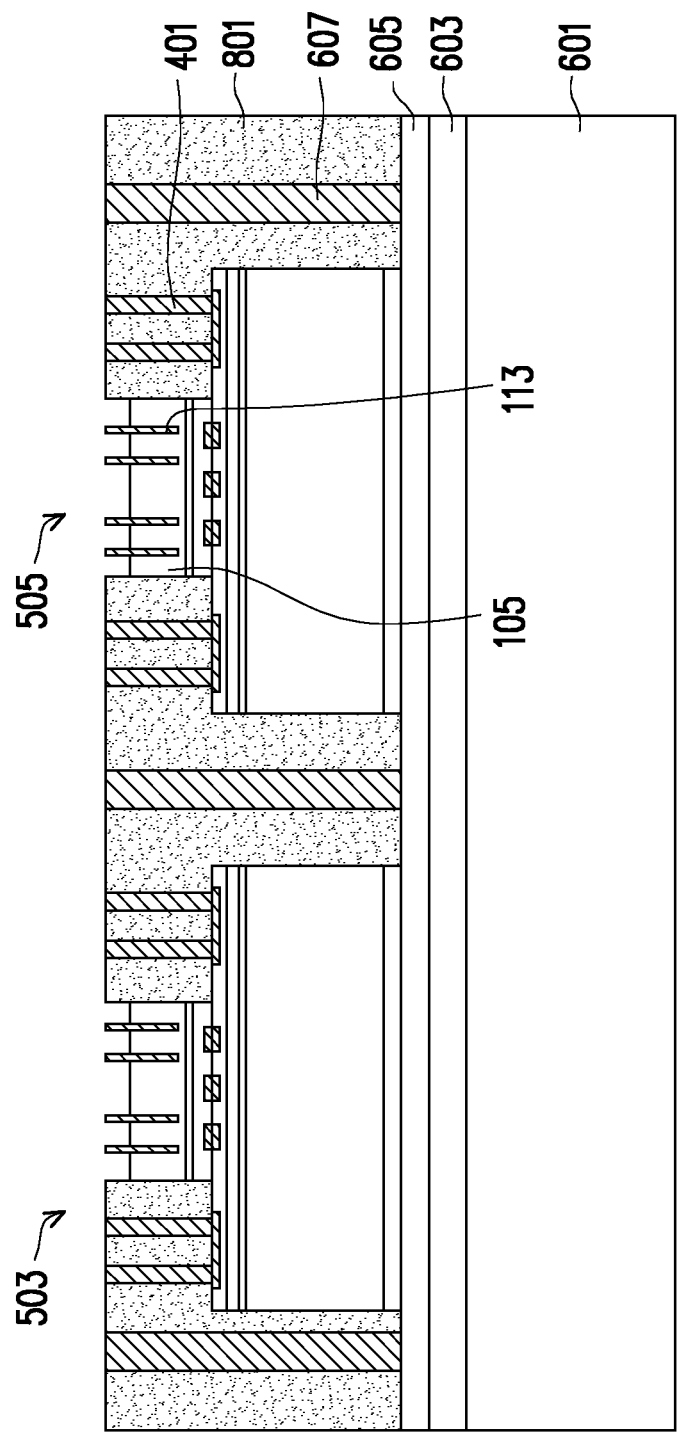

FIG. 21 illustrates a recessing of the first substrates 105. In an embodiment the recessing of the first substrate 105 may be performed as described above with respect to FIG. 5, such as by utilizing a wet or dry etching process to remove portions of the first substrate 105 such that the TSVs 113 extend away from the first substrates 105. Additionally, the etchants utilized for the recessing may be selective to the material of the first substrate 105 such that a minimal amount or none of the surrounding materials, such as the encapsulant 801, is removed. As such, a recess is formed within the encapsulant 801, wherein the TSVs 113 extend into the recess within the encapsulant 801.

Figure 22:
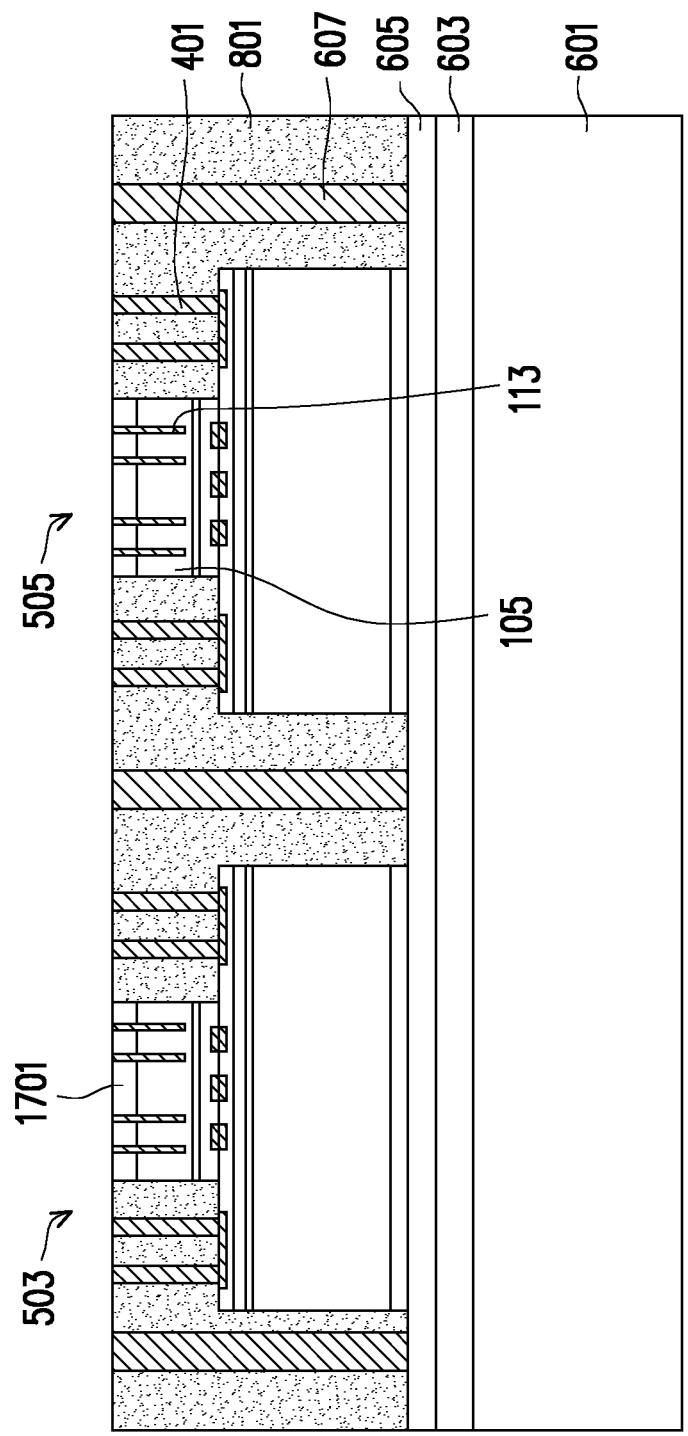

FIG. 22 illustrates a placement of the second dielectric material 1701 within the recess and over the TSVs 113. In an embodiment the second dielectric material 1701 may be similar to the dielectric material 501, such as by being a low temperature cured polyimide material, although any suitable material may be utilized. Once the second dielectric material 1701 has been placed using, e.g., a spin coating process, the second dielectric material 1701, similar to the dielectric material 501, may be cured.

FIG. 22 additionally illustrates that, once the second dielectric material 1701 has been placed and cured, the second dielectric material 1701 is planarized in order to expose the TSVs 113. In an embodiment the second dielectric material 1701 is planarized using a chemical mechanical polishing process, although any suitable planarization process may be utilized. By planarizing the second dielectric material 1701, the second dielectric material 1701 is coplanar with the TSVs 113, the encapsulant 801, the first TIVs 401, and the second TIVs 607.

Figure 23:
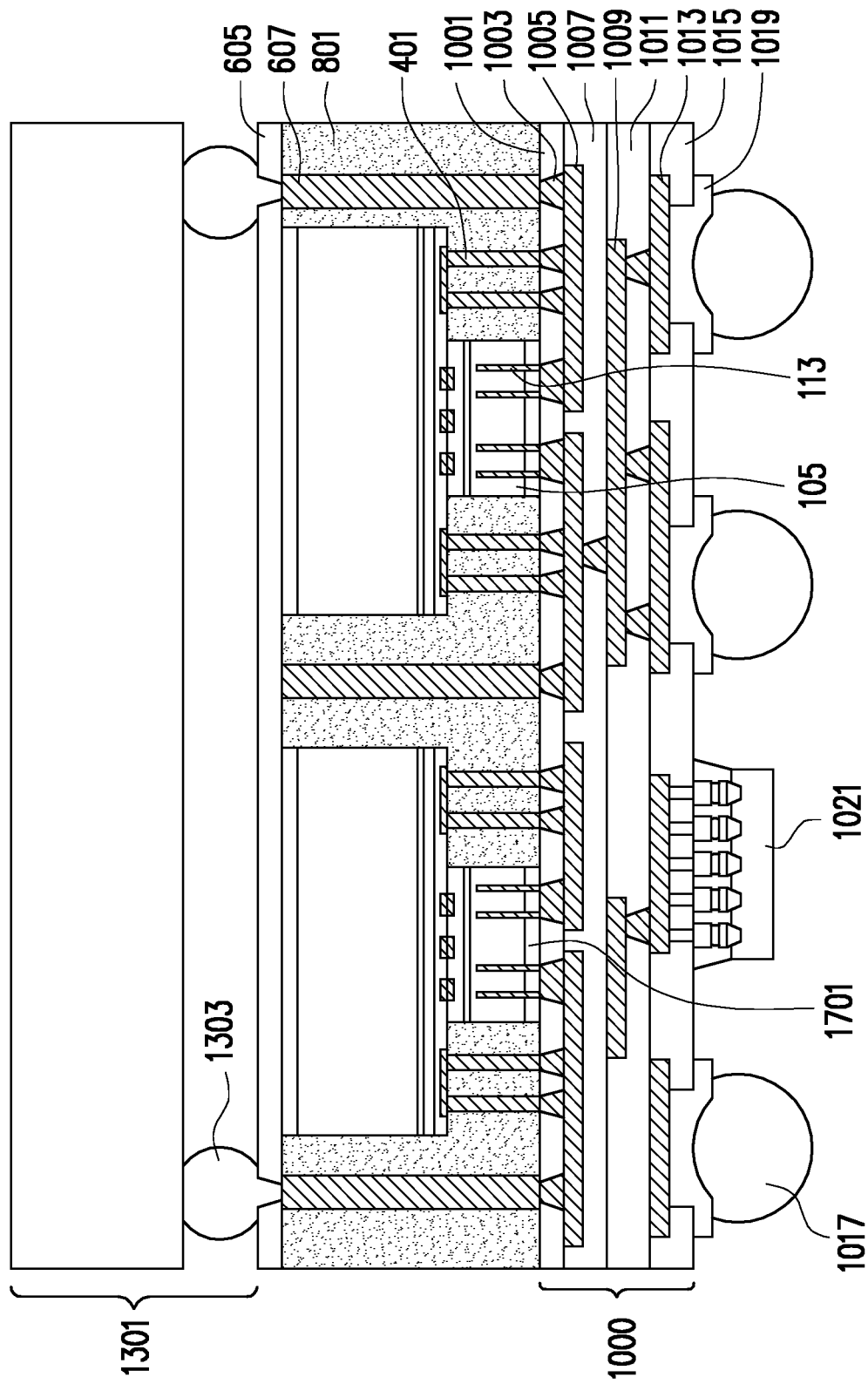

FIG. 23 illustrates that, once the second dielectric material 1701 is planarized and the first TIVs 401 exposed, the remainder of the steps as described above with respect to FIGS. 10-14 may be performed. For example, the redistribution structure 1000 may be formed, the fourth external connections 1303 are placed, and the third package 1301 may be bonded. However, any suitable steps may be performed.

FIGS. 24-32 illustrate another embodiment in which the first TIVs 401 and the second TIVs 607 (not illustrated in FIG. 24) are formed simultaneously with each other. In this embodiment, and looking at FIG. 24 first, the first semiconductor device 101 and the second semiconductor device 103 are bonded to the second bond layer 205 and the second bond metal 207 as described above with respect to FIG. 2. For example, the first semiconductor device 101 and the second semiconductor device 103 may be bonded using, for example, a hybrid bonding process. However, any suitable bonding process may be utilized.

Figure 24:
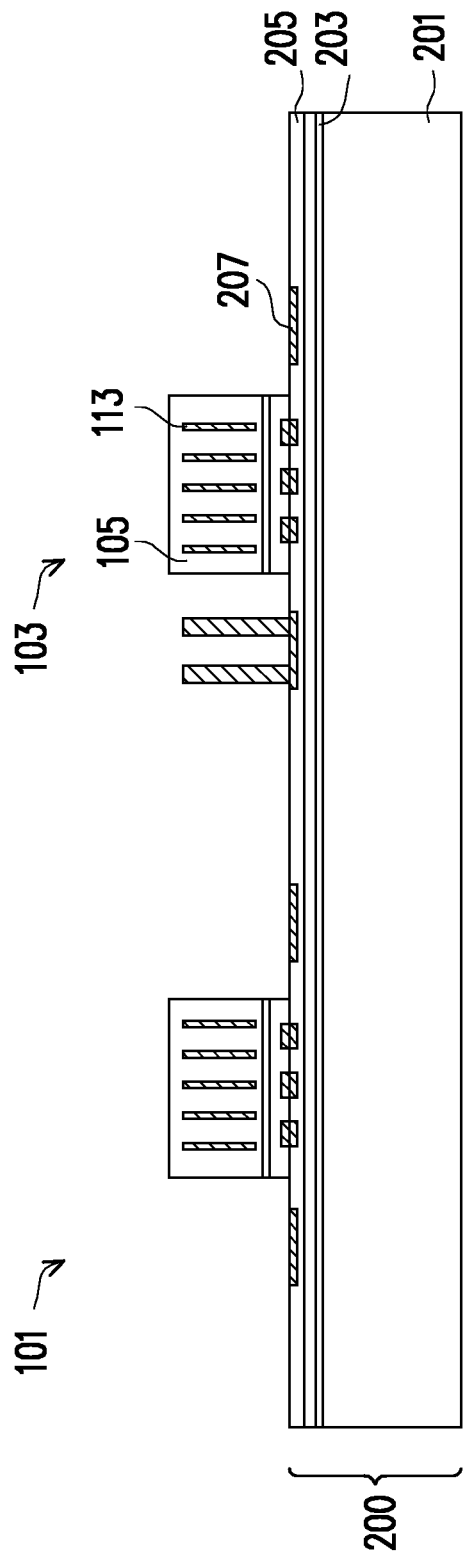
FIGS. 24-32 illustrate another embodiment in which the first TIVs and second TIVs are formed simultaneously in accordance with some embodiments.

FIG. 24 additionally illustrates a thinning of the first semiconductor device 101 and the second semiconductor device 103. In an embodiment the first semiconductor device 101 and the second semiconductor device 103 may be thinned using a planarization process, such as a chemical mechanical polishing (CMP) process, although any suitable process may be utilized. However, in this embodiment the through substrate vias 113 are not exposed by the planarization process and the through substrate vias 113 remain covered by the semiconductor material.

Figure 25:
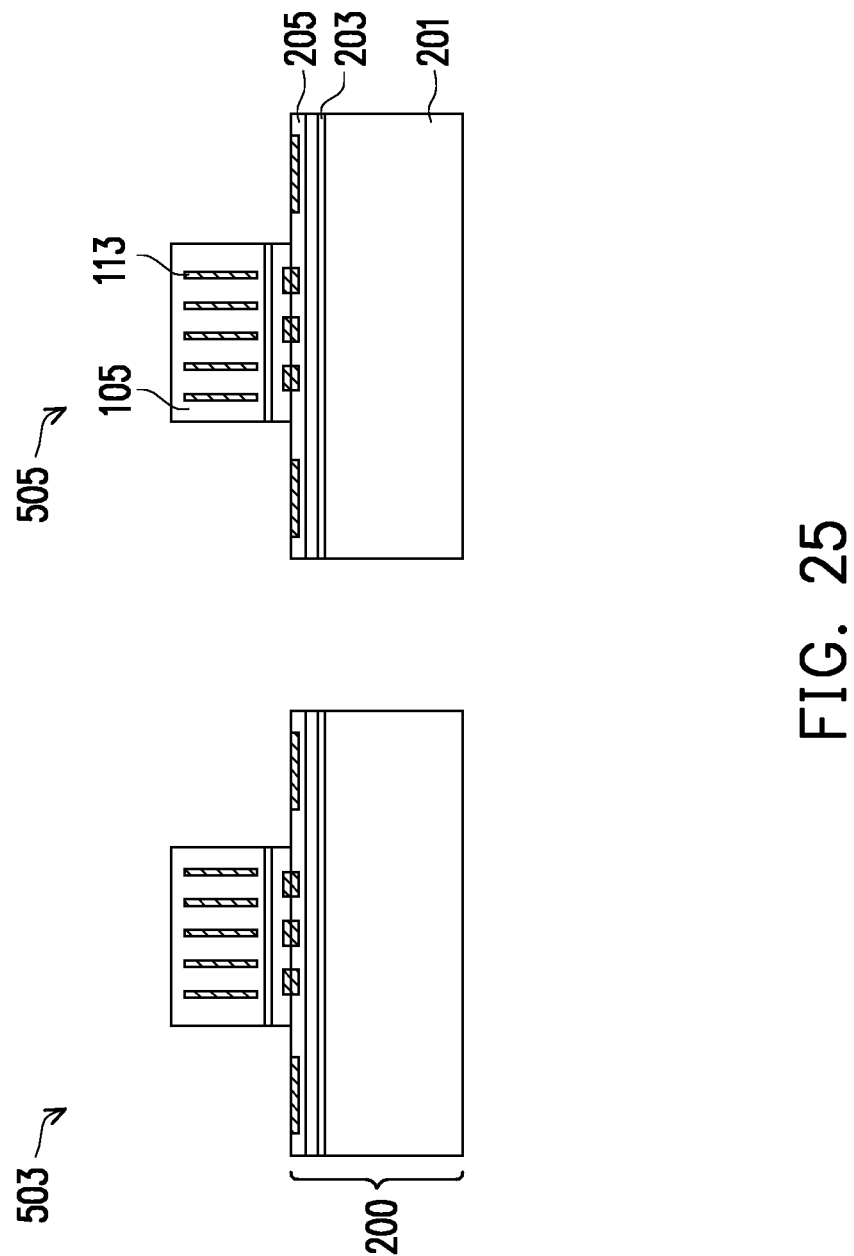

FIG. 25 illustrates that, once the first semiconductor device 101 and the second semiconductor device have been thinned, the first wafer 200 may be thinned and then singulated. In an embodiment a back side of the first wafer 200 may be thinned utilizing, for example, a planarization process such as a chemical mechanical planarization process. However, any suitable process for thinning the first wafer 200, such as a series of one or more etches or a combination of polishing and etching, may also be utilized.

After the first wafer 200 has been thinned, the first wafer 200 may be singulated to form the first package 503 (e.g., the system on integrated circuit package (SoIC)) and the second package 505. In an embodiment the first wafer 200 is singulated using one or more saw blades. However, any suitable method of singulation, including laser ablation or one or more wet etches, may also be utilized.

FIG. 25 additionally illustrates that, at this point in the process of this embodiment, the first TIVs 401 have not yet been formed. Rather, certain ones of the second bond metal 207 (those that are not bonded to the first semiconductor device 101 and the second semiconductor device 103) are left exposed during the singulation process. As such, the singulation process occurs without the presence of the first TIVs 401.

Figure 26:
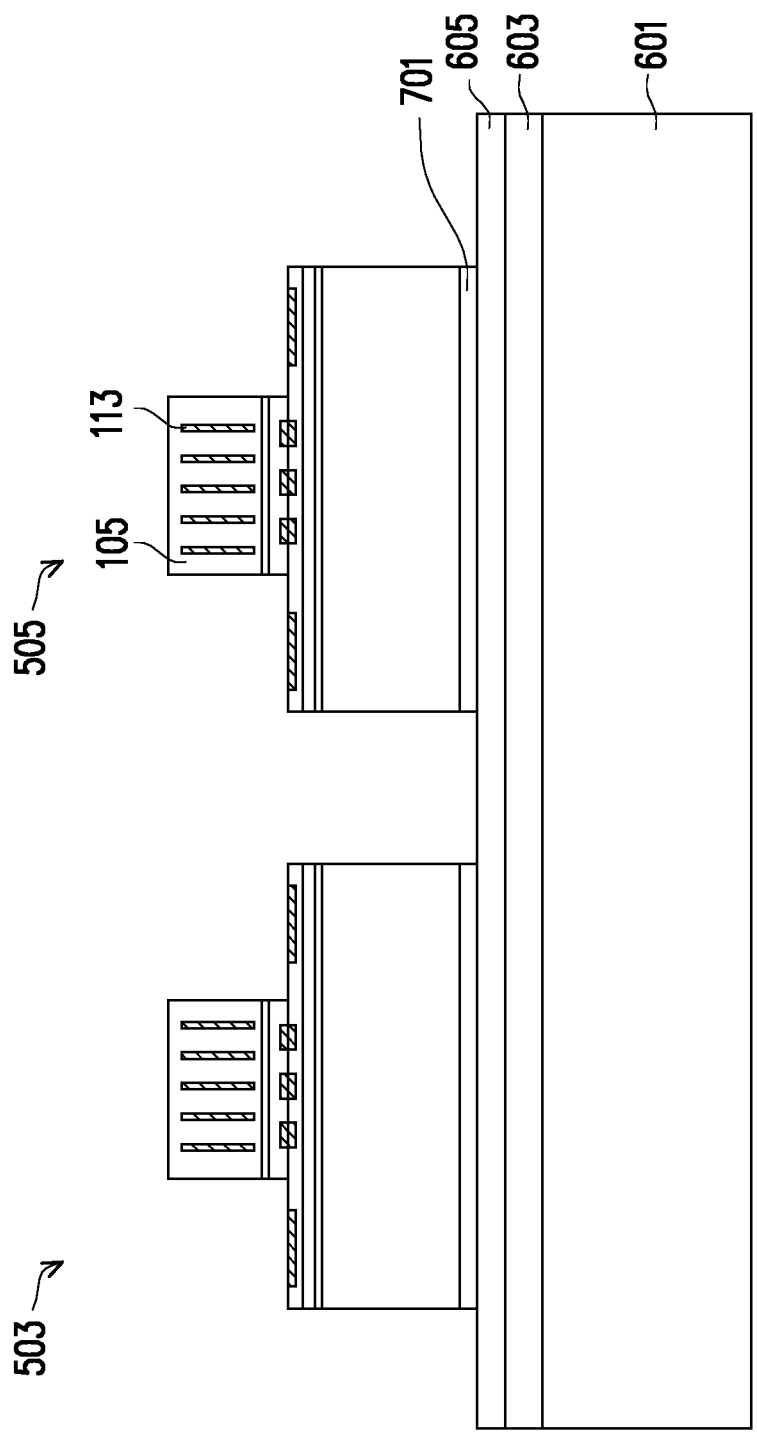

FIG. 26 illustrates a placement of the first package 503 and the second package 505 onto the polymer layer 605 with, e.g., the adhesive 701. In an embodiment the first package 503 and the second package 505 may be placed using, e.g. a pick and place process. However, any suitable method of placing the first package 503 and the second package 505 may be utilized.

FIG. 26 additionally illustrates that, at this point in the process of this embodiment, the first TIVs 401 still have yet to be formed. As such, the placement of the first package 503 and the second package 505 is also performed prior to the formation of the second TIVs 607. Accordingly, the placement of the photoresist and the plating process that are described above as being utilized to form the second TIVs 607 are delayed until a later point in the process (described further below).

Figure 27:
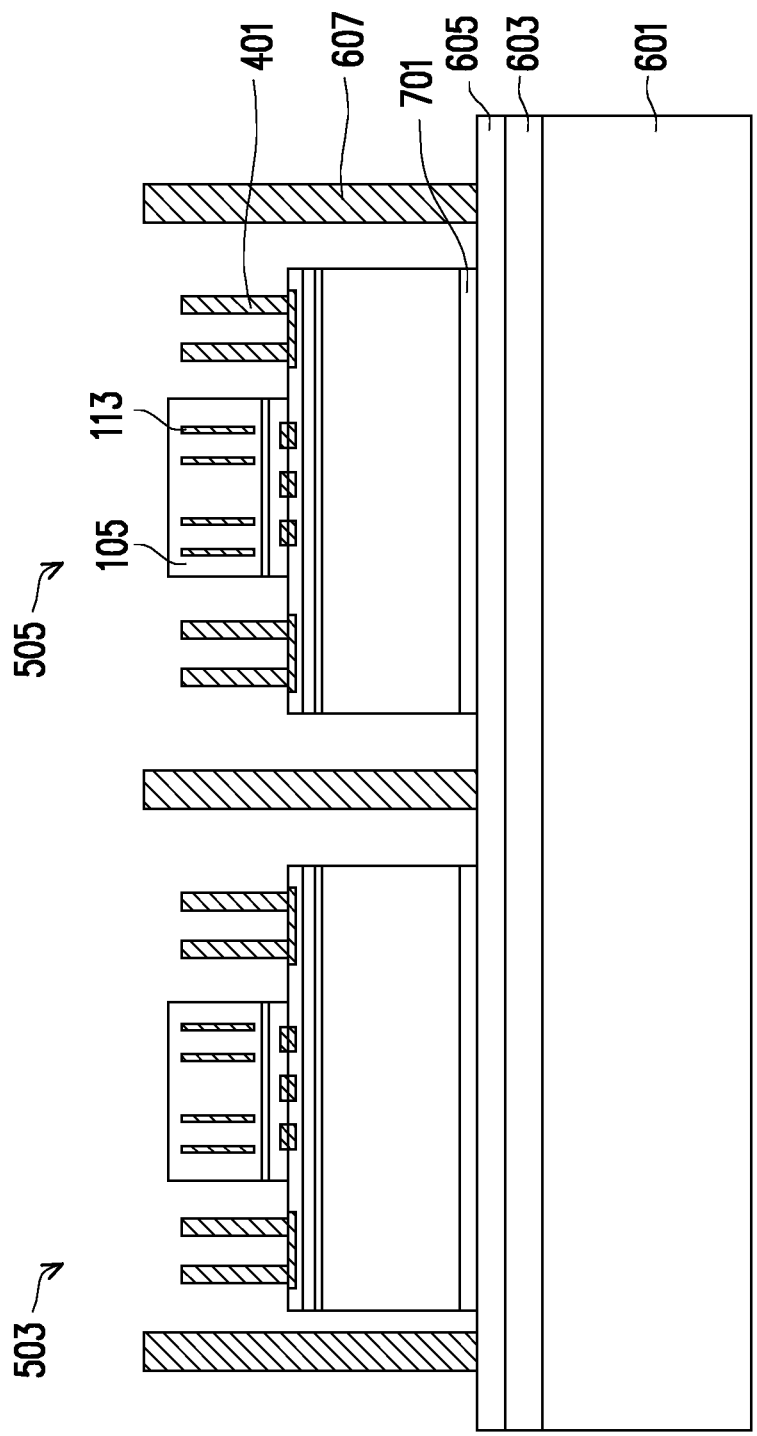

FIG. 27 illustrates a simultaneous formation of both the first TIVs 401 and the second TIVs 607. In an embodiment, to initiate the formation of both the first TIVs 401 and the second TIVs 607, a seed layer (not separately illustrated) is formed over the polymer layer 605, the first package 503, and the second package 505. The seed layer is a thin layer of a conductive material that aids in the formation of a thicker layer during subsequent processing steps. The seed layer may comprise a layer of titanium about 500 Å thick followed by a layer of copper about 3,000 Å thick. The seed layer may be created using processes such as sputtering, evaporation, or PECVD processes, depending upon the desired materials. The seed layer may be formed to have a thickness of between about 0.3 µm and about 1 µm, such as about 0.5 µm.

Once the seed layer is formed, a photoresist (also not illustrated) is placed and patterned over the seed layer. In an embodiment the photoresist may be placed on the seed layer using, e.g., a dry film lamination process or a spin coating technique to a height of between about 50 µm and about 250 µm, such as about 240 µm. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern.

In an embodiment the pattern formed into the photoresist is a pattern for the first TIVs 401 and the second TIVs 607. The first TIVs 401 and the second TIVs 607 are formed in such a placement as to be located on different sides of the first package 503 and the second package 505 as well as on the first package 503 and the second package 505. However, any suitable arrangement for the pattern of the first TIVs 401 and the second TIVs 607 may also be utilized.

The first TIVs 401 and the second TIVs 607 are formed within the photoresist. In an embodiment the first TIVs 401 and the second TIVs 607 comprise one or more conductive materials, such as copper, tungsten, other conductive metals, or the like, and may be formed, for example, by electroplating, electroless plating, or the like. In an embodiment, an electroplating process is used wherein the seed layer and the photoresist are submerged or immersed in an electroplating solution. The seed layer surface is electrically connected to the negative side of an external DC power supply such that the seed layer functions as the cathode in the electroplating process. A solid conductive anode, such as a copper anode, is also immersed in the solution and is attached to the positive side of the power supply. The atoms from the anode are dissolved into the solution, from which the cathode, e.g., the seed layer, acquires the dissolved atoms, thereby plating the exposed conductive areas of the seed layer within the opening of the photoresist.

Once the first TIVs 401 and the second TIVs 607 have been formed using the photoresist and the seed layer, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may alternatively be utilized. The removal of the photoresist may expose the underlying portions of the seed layer.

Once the first TIVs 401 and the second TIVs 607 have been formed, exposed portions of the seed layer are then removed. In an embodiment the exposed portions of the seed layer (e.g., those portions that are not covered by the first TIVs 401 and the second TIVs 607) may be removed by, for example, a wet or dry etching process. For example, in a dry etching process reactants may be directed towards the seed layer, using the first TIVs 401 and the second TIVs 607 as masks. In another embodiment, etchants may be sprayed or otherwise put into contact with the seed layer in order to remove the exposed portions of the seed layer. Any suitable method of removing the seed layer may be utilized.

Figure 28:
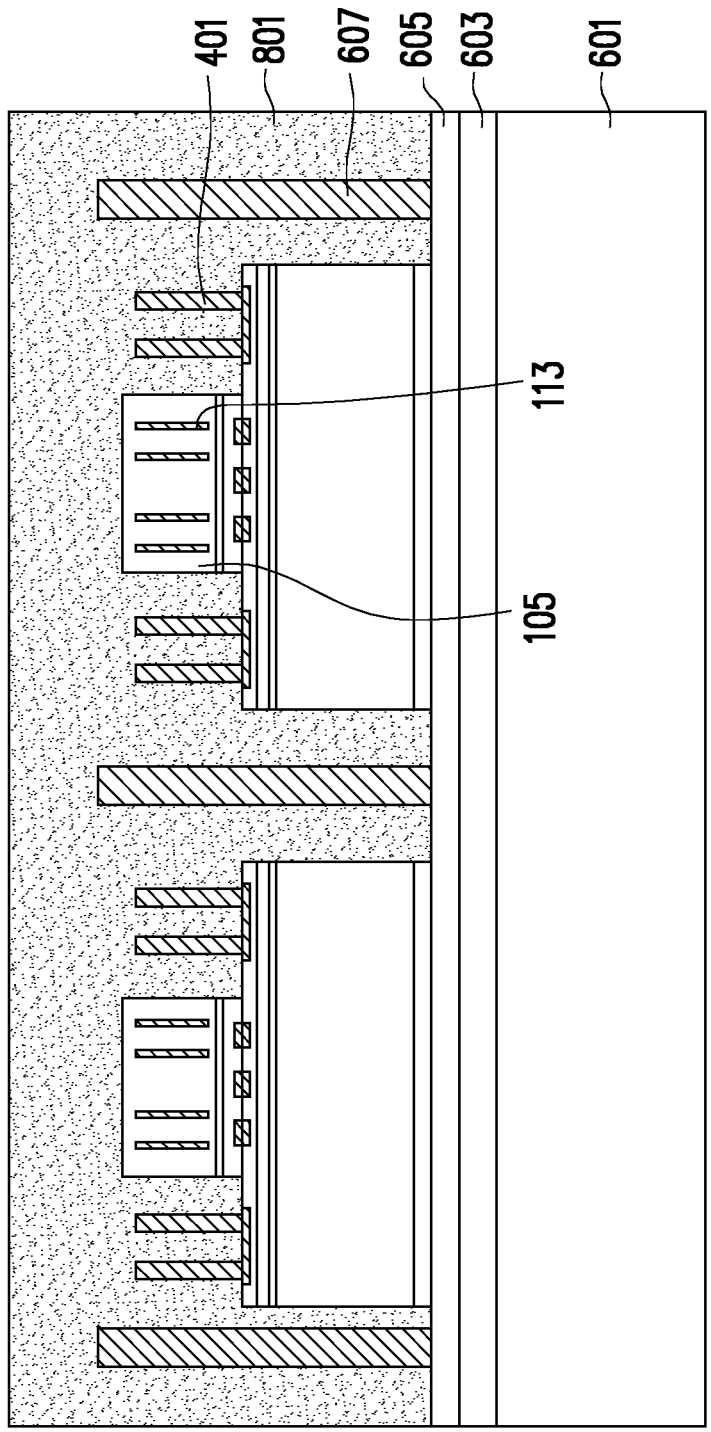

FIG. 28 illustrates an encapsulation of the first TIVs 401 and the second TIVs 607 along with the first package 503 and the second package 505. In an embodiment the encapsulant may be applied as described above with respect to FIG. 8. However, in this embodiment the encapsulant 801 will be in physical contact with both the first TIVs 401 and the second TIVs 607. In particular, as the encapsulant 801 is placed into the molding chamber, the encapsulant 801 will flow between the second TIVs 607, the first semiconductor device 101 and the second semiconductor device 103.

Figure 29:
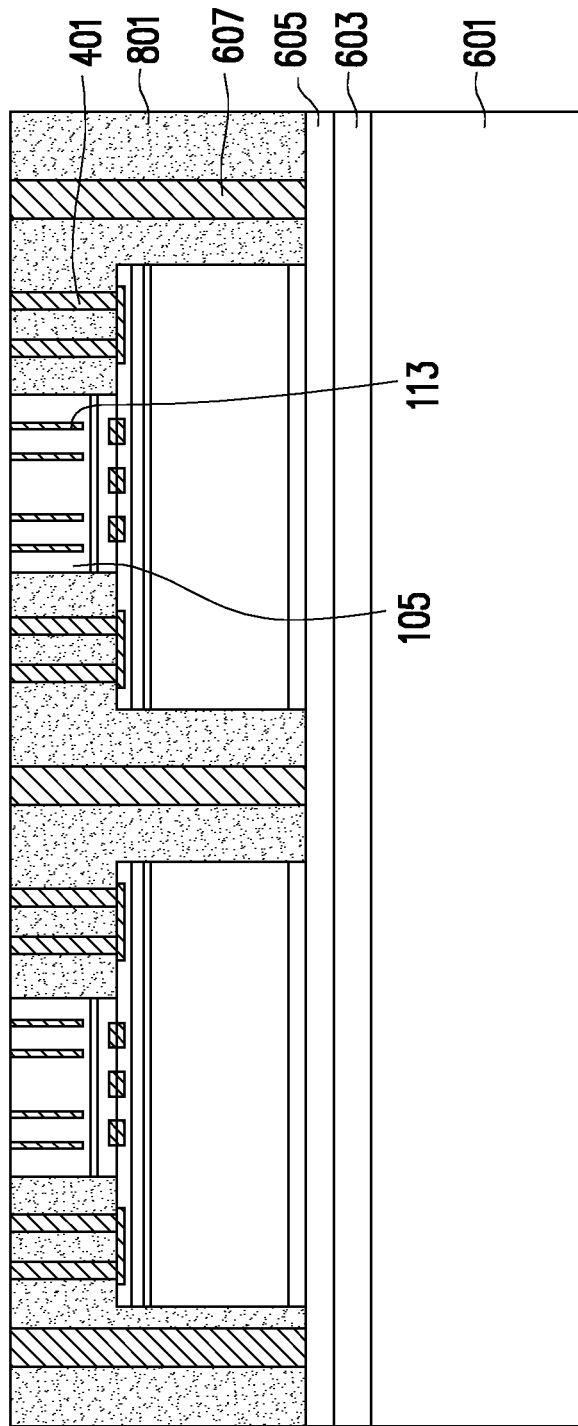

FIG. 29 illustrates a thinning of the encapsulant 801 in order to expose the second TIVs 607 and the first TIVs 401 while also exposing the TSVs 113 within the first semiconductor device 101 and the second semiconductor device 103. The thinning may be performed, e.g., using a mechanical grinding or CMP process whereby chemical etchants and abrasives are utilized to react and grind away the encapsulant 801, the first semiconductor device 101 and the second semiconductor device 103 until the second TIVs 607, the first TIVs 401, and the TSVs 113 have been exposed. As such, the second TIVs 607, the first TIVs 401, and the TSVs 113 may have a planar surface that is also coplanar with the encapsulant 801.

Figure 30:
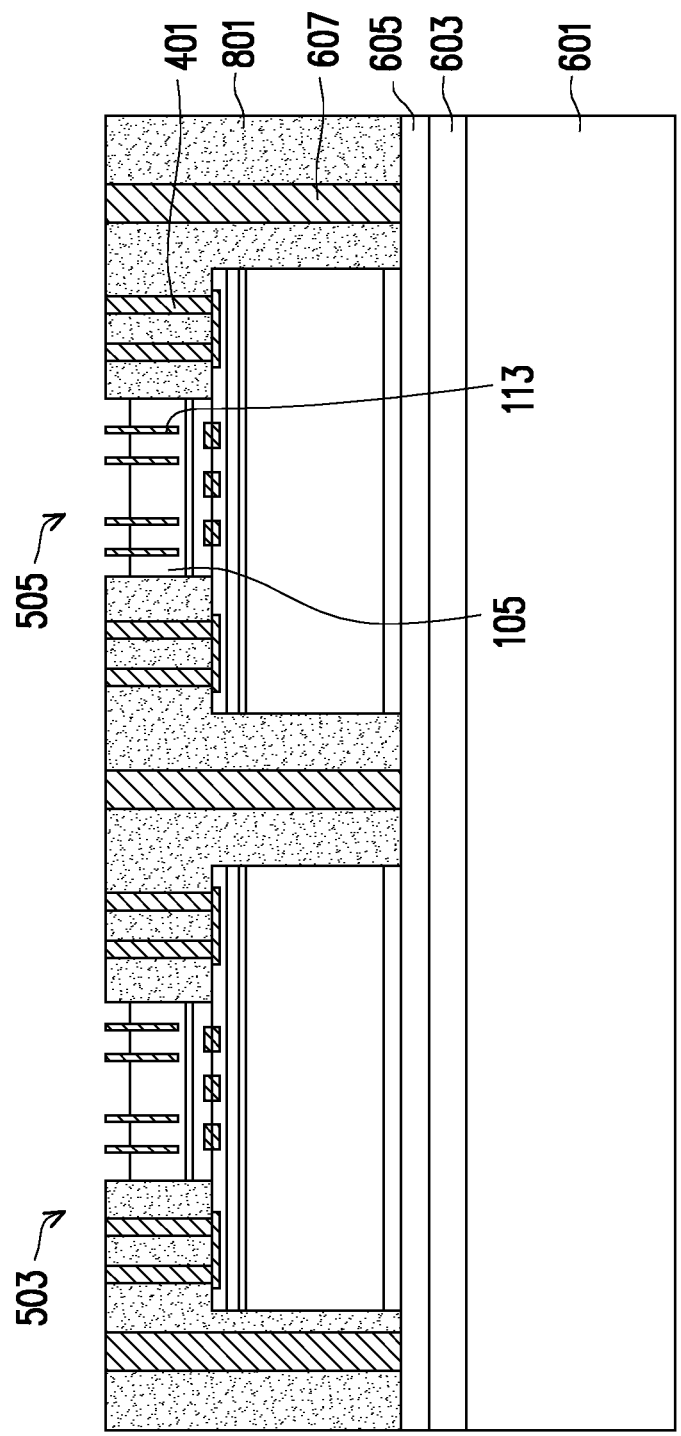

FIG. 30 illustrates a recessing of the first substrates 105. In an embodiment the recessing of the first substrate 105 may be performed as described above with respect to FIG. 5, such as by utilizing a wet or dry etching process to remove portions of the first substrate 105 such that the TSVs 113 extend away from the first substrates 105. Additionally, the etchants utilized for the recessing may be selective to the material of the first substrate 105 such that a minimal amount or none of the surrounding materials, such as the encapsulant 801, is removed. As such, a recess is formed within the encapsulant 801, wherein the TSVs 113 extend into the recess within the encapsulant 801.

Figure 31:
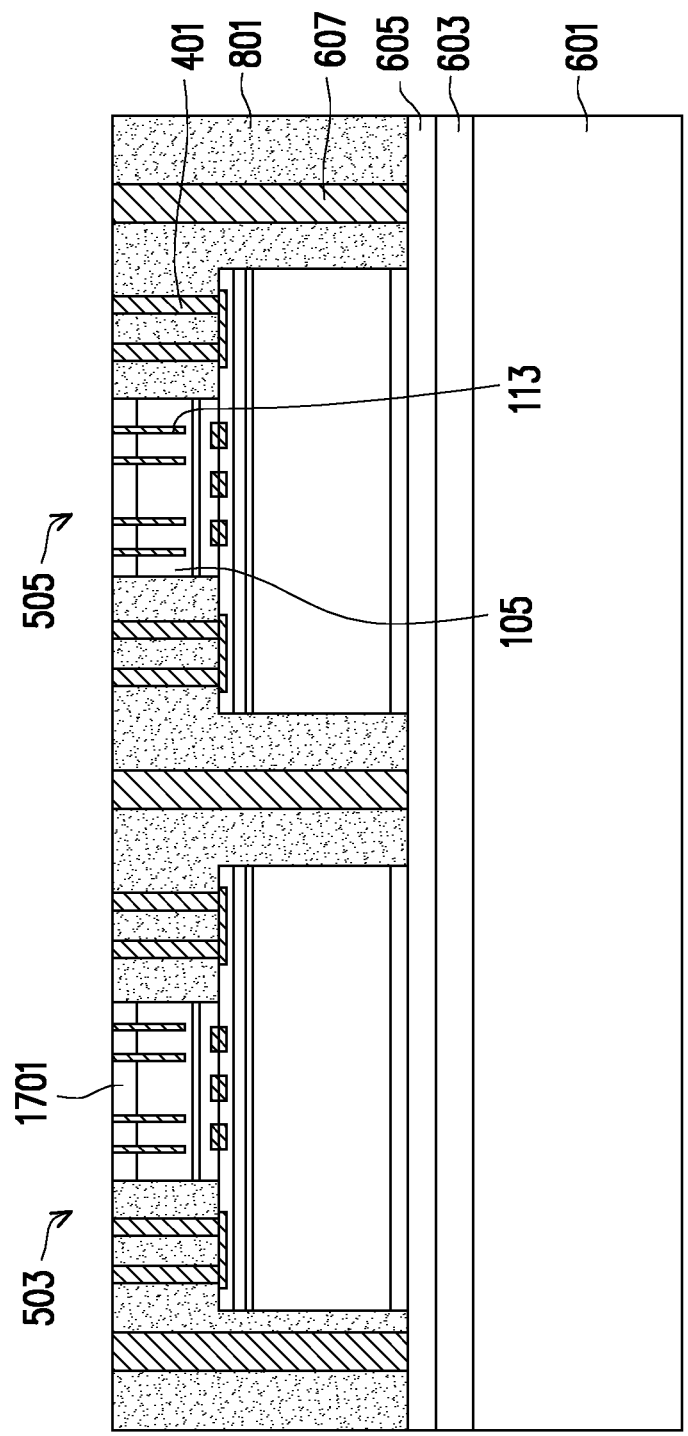

FIG. 31 illustrates a placement of the second dielectric material 1701 within the recess and over the TSVs 113. In an embodiment the second dielectric material 1701 may be similar to the dielectric material 501, such as by being a low temperature cured polyimide material, although any suitable material may be utilized. Once the second dielectric material 1701 has been placed using, e.g., a spin coating process, the second dielectric material 1701, similar to the dielectric material 501, may be cured.

FIG. 31 additionally illustrates that, once the second dielectric material 1701 has been placed and cured, the second dielectric material 1701 is planarized in order to expose the TSVs 113. In an embodiment the second dielectric material 1701 is planarized using a chemical mechanical polishing process, although any suitable planarization process may be utilized. By planarizing the second dielectric material 1701, the second dielectric material 1701 is coplanar with the TSVs 113, the encapsulant 801, the first TIVs 401, and the second TIVs 607.

Figure 32:
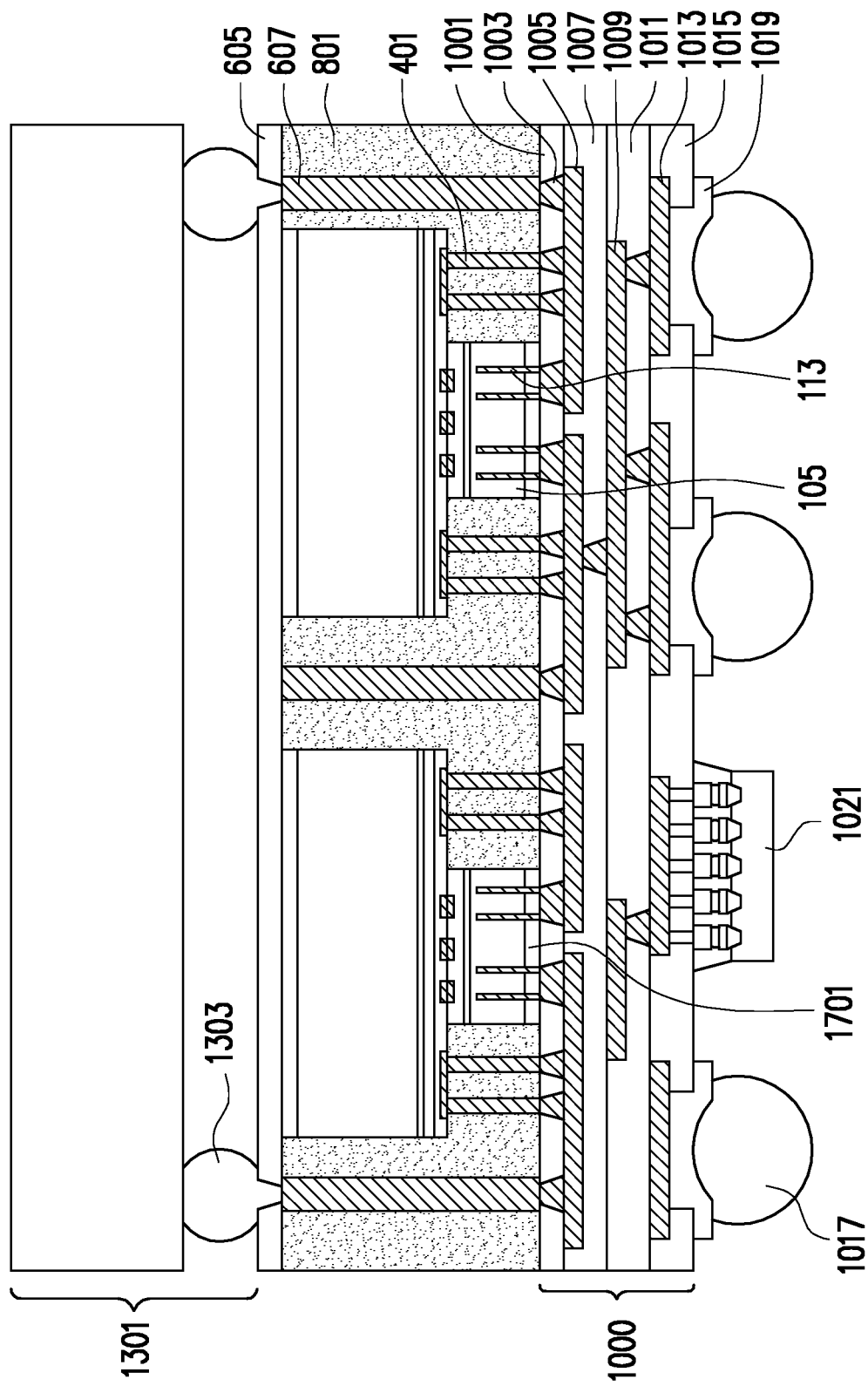

FIG. 32 illustrates that, once the second dielectric material 1701 is planarized and the first TIVs 401 exposed, the remainder of the steps as described above with respect to FIGS. 10-14 may be performed. For example, the redistribution structure 1000 may be formed, the fourth external connections 1303 are placed, and the third package 1301 may be bonded. However, any suitable steps may be performed.

In accordance with an embodiment, a method of manufacturing a semiconductor device includes attaching a first semiconductor device and a second semiconductor device to a first wafer; forming first through interposer vias adjacent to the first semiconductor device and the second semiconductor device; exposing through substrate vias by removing a portion of the first semiconductor device and the second semiconductor device; applying a dielectric material around the first through interposer vias; singulating the first wafer to form a first package and a second package; attaching the first package and the second package to a carrier wafer, wherein second through interposer vias are located on the carrier wafer; encapsulating the first package, the second package, and the second through interposer vias with an encapsulant; thinning the encapsulant to expose the through substrate vias; and forming a redistribution structure over the encapsulant. In an embodiment, the attaching the first semiconductor device and the second semiconductor device forms a hybrid bond. In an embodiment, the method further includes thinning the first semiconductor device after the attaching the first semiconductor device and prior to the forming the first through interposer vias. In an embodiment, the exposing the through substrate vias is performed prior to the applying the dielectric material. In an embodiment, the exposing the through substrate vias is performed after the applying the dielectric material. In an embodiment, the method further includes applying a second dielectric material around the through substrate vias after the exposing the through substrate vias. In an embodiment the method further includes planarizing the second dielectric material to be coplanar with the dielectric material.

In accordance with another embodiment, a method of manufacturing a semiconductor device includes attaching a first die and a second die to a first wafer, the first die comprising first through substrate vias; thinning the first die and the second die without exposing the first through substrate vias; forming first through interposer vias on the first wafer after the thinning the first die and the second die; applying a dielectric material around the first die, the second die, and the first through interposer vias; singulating the first wafer to form a first package and a second package; encapsulating the first package, the second package, and second through interposer vias with an encapsulant; thinning the encapsulant to expose the first through substrate vias; recessing a portion of the first die and a portion of the second die after the thinning the encapsulant; applying a second dielectric material into the recess; and forming a redistribution structure over the second dielectric material. In an embodiment, the first package and the second package are attached to a polymer layer prior to the encapsulating the first package, the second package, and the second through interposer vias. In an embodiment, the method further includes forming an opening through the polymer layer. In an embodiment, the method further includes attaching a third package to the second through interposer vias through the opening in the polymer layer. In an embodiment, the attaching the first die and the second die is performed at least in part through a hybrid bonding process. In an embodiment, the attaching the first die is performed by bonding a first bond metal of the first die to a second bond metal of the first wafer, the first bond metal being within a first metallization layer. In an embodiment, the method further includes planarizing the second dielectric material at least until the second dielectric material is coplanar with the dielectric material.

In accordance with yet another embodiment, a method of manufacturing a semiconductor device includes thinning a first die and a second die without exposing first through substrate vias within the first die, wherein the first die is hybrid bonded to a first wafer prior to the thinning the first die; plating first through interposer vias onto the first wafer after the thinning the first die and the second die; forming a first package from the first die and the first wafer; forming a second package from the second die and the first wafer; plating second through interposer vias onto a carrier wafer; encapsulating the first package, the second package, and the second through interposer vias with an encapsulant, wherein the encapsulant is in physical contact with the first through interposer vias; planarizing the encapsulant to expose the first through substrate vias; exposing sidewalls of the first through substrate vias by removing a portion of the first die after the planarizing the encapsulant; and replacing the portion of the first die with a dielectric material. In an embodiment the method further includes planarizing the dielectric material until the dielectric material is coplanar with the encapsulant. In an embodiment the method further includes forming a redistribution structure over the dielectric material: and attaching a surface device to the redistribution structure. In an embodiment the method further includes attaching the first package and the second package to a polymer layer on the carrier wafer prior to the encapsulating the first package, the second package, and the second through interposer vias. In an embodiment the method further includes attaching a third package to the second through interposer vias through the polymer layer. In an embodiment the method further includes bonding a first bond metal of the first die to a second bond metal of the first wafer and bonding a first dielectric layer of the first die to a second dielectric layer of the first wafer, the first bond metal being within a first metallization layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a first via extending from a carrier substrate;
    forming a second via extending from a first semiconductor substrate, wherein after the forming the second via the second via is adjacent to a first semiconductor die;
    forming a third via extending from the first semiconductor substrate, wherein after the forming the third via the third via is adjacent to a second semiconductor device;
    attaching the first semiconductor substrate to the carrier substrate;
    forming an encapsulant on the carrier substrate adjacent the first semiconductor substrate and the first via; and
    removing a portion of the encapsulant to expose the second via and the third via.

2. The method of claim 1, wherein the first semiconductor die comprises through substrate vias and wherein the removing the portion of the encapsulant exposes the through substrate vias.

3. The method of claim 1, further comprising bonding the first semiconductor die to the first semiconductor substrate.

4. The method of claim 3, wherein the bonding the first semiconductor substrate comprises performing a hybrid bonding process.

5. The method of claim 1, further comprising forming a dielectric material along sidewalls of the second via.

6. The method of claim 1, wherein the first semiconductor die comprises through substrate vias, further comprising recessing a surface of the first semiconductor die to expose a sidewall of the through substrate vias.

7. A method of manufacturing a semiconductor device, the method comprising:
    forming first through vias on a carrier substrate;
    bonding a first structure to the carrier substrate, the first structure comprising:
        a semiconductor substrate;
        a first semiconductor die bonded to the semiconductor substrate, the first semiconductor die comprising second through vias;
        third through vias adjacent to the first semiconductor die;
        a first encapsulant in physical contact with each of the semiconductor substrate, the second through vias, and the third through vias;
    encapsulating the first encapsulant and the first through vias with a second encapsulant; and
    simultaneously removing portions of the first encapsulant and the second encapsulant to expose each of the first through vias, the second through vias, and the third through vias.

8. The method of claim 7, wherein the third through vias have a first length and wherein the first semiconductor die has a second length smaller than the first length.

9. The method of claim 8, wherein the first length is between 1 mm and 30 mm.

10. The method of claim 9, wherein the first length is between 1 mm and 10 mm.

11. The method of claim 10, wherein the third through vias have a first width of between 10 μm and 50 μm.

12. The method of claim 10, wherein the third through vias have a first width of between 10 μm and 30 μm.

13. The method of claim 7, further comprising forming one or more redistribution layers in physical contact with the first through vias, the second through vias, and the third through vias.

14. The method of claim 13, further comprising connecting a package to the first through vias on an opposite side of the first through vias from the one or more redistribution layers.

15. A method of manufacturing a semiconductor device, the method comprising:
forming first through vias within a semiconductor die;
forming second through vias on a semiconductor substrate;
forming third through vias on a carrier wafer;
after forming the first through vias, bonding the semiconductor die to the semiconductor substrate;
bonding the semiconductor substrate on the carrier wafer; and
planarizing each of the first through vias, the second through vias, and the third through vias with a first planarization process.

16. The method of claim 15, wherein the second through vias and the third through vias are formed simultaneously with each other.

17. The method of claim 15, further comprising encapsulating the second through vias and the third through vias.

18. The method of claim 17, wherein the encapsulating simultaneously places an encapsulant into physical contact with both the second through vias and the third through vias.

19. The method of claim 17, further comprising recessing a semiconductor material from the first through vias, the semiconductor material being part of the semiconductor die.

20. The method of claim 19, wherein the recessing occurs after the encapsulating the second through vias and the third through vias.

* * * * *